United States Patent
King et al.

(10) Patent No.: US 10,048,304 B2
(45) Date of Patent: Aug. 14, 2018

(54) TEST SYSTEM SUPPORTING SIMPLIFIED CONFIGURATION FOR CONTROLLING TEST BLOCK CONCURRENCY

(75) Inventors: Jason D. King, Derry, NH (US); Richard Pye, Burlington, MA (US); Randall B. Stimson, Fort Lauderdale, FL (US); Steven R. Shirk, Encino, CA (US)

(73) Assignee: Teradyne, Inc., North Reading, MA (US)

(*) Notice: Subject to any disclaimer, the term of this patent is extended or adjusted under 35 U.S.C. 154(b) by 1419 days.

(21) Appl. No.: 13/281,148

(22) Filed: Oct. 25, 2011

(65) Prior Publication Data
US 2013/0102091 A1 Apr. 25, 2013

(51) Int. Cl.
*H01L 21/66* (2006.01)
*G06F 19/00* (2018.01)
(Continued)

(52) U.S. Cl.
CPC .............. *G01R 31/01* (2013.01); *H01L 22/20* (2013.01); *G01R 31/2834* (2013.01); *H01L 2924/0002* (2013.01)

(58) Field of Classification Search
CPC ......... H01L 2924/0002; H01L 2924/00; H01L 22/20
See application file for complete search history.

(56) References Cited

U.S. PATENT DOCUMENTS 6,460,068 B1 * 10/2002 Novaes ................ G06F 11/3688
714/E11.208
7,010,451 B2 * 3/2006 Dorough ............ G01R 31/2894
324/762.05

(Continued)

FOREIGN PATENT DOCUMENTS

CN 1321892 A 11/2001
JP 2002-055145 A 2/2002
(Continued)

OTHER PUBLICATIONS

International Search Report and Written Opinion for PCT/US2012/058971 dated Mar. 19, 2013.
Taiwanese Search Report for Taiwanese Application No. 101139167 dated Mar. 2, 2016.
Japanese Office Action for Japanese Application No. 2014-538814 dated Jul. 20, 2016 and English Translation herewith.
Taiwanese office action for Taiwanese Application No. 101139167 dated Feb. 15, 2017.

*Primary Examiner* — John Breene
*Assistant Examiner* — Yaritza H Perez Bermudez
(74) *Attorney, Agent, or Firm* — Wolf, Greenfield & Sacks, P.C.

(57) ABSTRACT

Techniques for configuring a test system that enable simple specification of a degree of concurrency in testing separate functional portions of a semiconductor device. For a test flow with multiple sub-flows, the pins accessed in connection with each sub-flow may define a flow domain. Site regions, each associated with a flow domain, may be defined. Tester sites may be associated with each of these flow domain specific site regions and independently operating resources may be assigned to these tester sites. A second portion of the defined site regions may be associated with tester sites, but resources assigned to these site regions may be accessed from multiple flow domains. Test blocks, even if not developed for concurrent execution, may be executed concurrently using resources in the flow domain specific site regions. Flexibility is provided to share resources through the use of the second portion of the site regions.

32 Claims, 10 Drawing Sheets

(51) Int. Cl.
*G01R 31/20* (2006.01)
*G01R 31/01* (2006.01)
*G01R 31/28* (2006.01)

(56) References Cited

U.S. PATENT DOCUMENTS

| | | | |
|---|---|---|---|
| 2002/0070725 A1* | 6/2002 | Hilliges | G01R 31/31907 714/724 |
| 2003/0131327 A1* | 7/2003 | Dervisoglu | G01R 31/31850 714/727 |
| 2004/0059972 A1 | 3/2004 | Khoche | |
| 2004/0225459 A1* | 11/2004 | Krishnaswamy | G01R 31/3183 702/57 |
| 2005/0193294 A1* | 9/2005 | Hildebrant | G01R 31/2886 714/723 |
| 2005/0234674 A1* | 10/2005 | Bundy | G01R 31/31919 702/119 |
| 2005/0262396 A1 | 11/2005 | Woodward et al. | |
| 2006/0248425 A1* | 11/2006 | Stimson | G01R 31/31707 714/741 |
| 2009/0024324 A1* | 1/2009 | Clark | G01R 31/2893 702/1 |
| 2009/0037132 A1 | 2/2009 | Zhou et al. | |
| 2010/0241408 A1 | 9/2010 | Ditlinger et al. | |
| 2011/0275170 A1* | 11/2011 | Van Wagenen | G01R 31/31907 438/14 |
| 2012/0191400 A1* | 7/2012 | Sontakke | G01R 31/31917 702/119 |

FOREIGN PATENT DOCUMENTS

| | | |
|---|---|---|
| JP | 2003-172771 A | 6/2003 |
| JP | 2004-117352 A | 4/2004 |
| JP | 2010-085404 A | 4/2010 |
| JP | 2010-107230 A | 5/2010 |
| WO | WO 2011/001462 A1 | 1/2011 |

* cited by examiner

TEST SYSTEM SUPPORTING SIMPLIFIED CONFIGURATION FOR CONTROLLING TEST BLOCK CONCURRENCY

BACKGROUND

Test systems are widely used to test semiconductor devices at multiple stages during their manufacture. A test system includes components, called resources, that can generate and measure signals that can establish and measure an operating state of a device under various conditions. A resource, for example, may be an arbitrary waveform generator that can be programmed to generate a waveform of a desired shape. Another type of resource may capture a sequence of samples of an analog signal. Yet another type of resources may generate or measure DC voltages or currents or digital signals. A test is executed by controlling the resources to generate and measure test signals at multiple test points of a device under test.

Before executing a test, the test system is configured for the particular type of semiconductor device being tested. The test, in conjunction with the configuration information needed to configure the test system to execute the test, may be regarded as a test plan. This configuration information may involve multiple levels of mapping to relate one or more resources in the tester to each of the test points on a device under test. For example, a test system may have access points, sometimes called "channels," at which signals to or from resources may be accessed by components that connect the test system to a device under test.

A mapping may be specified between one or more resources and each of the "channels" of the test system where signals to or from those resources can be accessed. A test system may also include an interface that maps each channel to a location, sometimes called a "pin," at which a connection to a specific test point on a device under test can be made. With these mappings, the test system can determine which resources to control to generate or measure a specific type of signal at a specific test point of a device under test.

A test system may include more resources than are required to test a single device under test. To speed average test time, and therefore reduce the cost of manufacturing semiconductor devices, the test system may be programmed to test multiple devices concurrently. Each device may be positioned at a user site during testing. To support testing of multiple devices, some test systems support tester-sites. Each tester-site may be connected to a user site such that each tester site may generate or measure the test signals for a device under test. When using multiple tester-sites, each tester-site may be configured with functionally equivalent resources such that the same types of signals may be generated or measured at each tester-site, thereby testing multiple devices coupled to the user sites concurrently.

In an embodiment in which tester sites are supported, user inputs may specify a test program and resource configuration that would be needed to test a representative device. Separately, the user may specify information about the user sites. An automated tool may aid the user determine how to configure the tester resources to have an instance of the test program running for each user site. Each instance of the test program may control an associated tester site. Accordingly, a further aspect of configuring a test system for testing multiple semiconductor devices may entail specifying which resources collectively form a tester-site. Using this information, the test system can then concurrently execute an instance of a test program for each of the user sites.

To support such concurrent test, the test system may support tester-site specific operations. The test system hardware, for example, may allow resources assigned to a tester site to be controlled together so that the resources of a tester-site can be started or stopped together. Additionally, the resources in each tester site may be operated independently of resources in other tester sites. With this independence, the test system may be controlled such that the resources associated with each user site operate in a way that is conditioned on measurements at that site. As a result, test execution in each user site may be controlled dynamically based on tests conducted on a device under test. For example, a test system may detect an erroneous operating condition associated with a device at one user site. The test system can flag that device as faulty while continuing to test devices at the other user sites. Those tests of other devices may continue even if the test system stops testing a faulty device connected to one of the user sites.

As semiconductor devices have gotten more complex, the complexity of testing has also increased. For example, semiconductor devices now may be designed with multiple "cores," each core performing a function. As a specific example, a semiconductor device may have a processing core, which performs digital computations and control functions. A separate core may generate audio output and yet another core may control a radio or other network interface. A test program for such a semiconductor device may be developed as multiple test blocks. Each test block may control resources to generate and measure test signals for testing a core.

Some cores may be functionally independent such that the test blocks for those cores can be executed at the same time without one test block interfering with results of the others. Though, some test blocks need to be executed at different times, either because cores within a device cannot concurrently operate independently or because a test system lacks sufficient resources to test all instances of the cores concurrently.

A further aspect of configuring a test system may entail specifying a "flow." The flow indicates the order in which test blocks are executed for testing a representative device. In a test system supporting multiple user sites, multiple instances of the flow may be executed, one for each user site.

When multiple test blocks can be executed concurrently, the flow may have multiple sub-flows, with each sub-flow being executed concurrently. When multiple user sites are used, each of which has a device with multiple cores, a test may entail at each user site a flow-instance, with each flow instance containing multiple sub-flows.

SUMMARY

Improvements in execution of tests on semiconductor devices that have multiple functional regions may be provided through the definition of flow domains, each including pins accessed in testing a region of a semiconductor device. Tester sites, organized into site regions, may be used in allocating resources for testing flow domains in a way that allows any suitable degree of concurrency in testing the functional regions, even when test programs are not specifically prepared for concurrent execution. Such concurrency may allow concurrent testing of multiple functional regions or serialized testing or any suitable mix of concurrent and serialized testing.

A simple mechanism also may be provided for configuring a test system for execution of test blocks relating to different functional portions of a semiconductor device. The test blocks may be executed with a specified degree of concurrency, which may be specified after the test blocks are developed.

In one aspect, the invention relates to a method of operating a test system to test a device that has a plurality of cores. Each core may have a plurality of pins, and the test system may have multiple tester-sites, and each tester-site may have hardware resources. The semiconductor device may be tested according to a method that includes configuring the test system by mapping each of a plurality of tester-sites to an associated core of the plurality of cores such that the hardware resources of each tester site are configured to access the pins of the associated core; and executing a test flow with a plurality of test blocks, each test block testing a core of the plurality of cores by controlling hardware resources in the associated tester site, some of the test blocks being executed concurrently.

In another aspect, the invention relates to a method of operating a test system of the type having resources that can be associated with at least one tester site of a plurality of tester sites, each tester site having a site identifier such that hardware resources of the test system associated with a tester site process a command directed to the site. The semiconductor device may be tested according to a method that includes configuring the test system to test at least one semiconductor component comprising a plurality of pins and a plurality of cores, each core comprising a sub-set of the plurality of pins. For each of the plurality of cores, the configuration may include associating a tester site of the plurality of tester sites with the core such that resources associated with the tester site access corresponding pins of the associated core during a test. A plurality of test blocks may then be executed in accordance with a test flow, each of the test blocks being configured to test a respective at least one associated core. A portion of the plurality of test blocks may be executed concurrently in a plurality of sub-flows, each of the plurality of test blocks controlling operation of resources in a tester site associated with the respective at least one associated core.

In yet a further aspect, any of the testing methods may be used as part of a method of manufacturing semiconductor devices. At least one manufacturing operation may be conditionally performed based on results of such a test.

In one aspect, the invention relates to at least one computer storage medium comprising instructions that, when executed on a computing system, control the computing system to generate a configuration for a test system to execute a test for at least one device under test. The test may comprise a plurality of test blocks executed in accordance with a specified flow, the flow comprising a plurality of sub-flows. Generating a configuration may include receiving input defining a plurality of flow domains, each flow domain representing a plurality of representative pins of a representative device under test accessed by execution of one or more test blocks during a respective sub-flow of the plurality of sub-flows. A plurality of site regions may be defined, each site region comprising at least one tester site, and each site region being associated with a flow domain. The configuration may be generated such that each site region has at least one tester site that contains resources for accessing at least one pin of a device under test during an instance of a test block of an associated flow domain.

In another aspect, the invention may relate to a method of programming a test system for concurrent testing a plurality of like devices. Each device may have a plurality of cores, each of the plurality of cores having a plurality of test points. The test system is configurable with a plurality of tester sites. To configure the test system, user input defining a plurality of flow domains may be received. Each of the flow domains may be defined by a set of test points of a representative device, each flow domain comprising test pins accessed during execution of test blocks in a sub-flow. A plurality of site regions may be defined, each site region comprising at least one tester site, and each site region being associated with a flow domain. The configuration may be generated such that each site region has at least one tester site that contains resources for accessing at least one pin of a device under test during an instance of a test block of an associated flow domain.

In yet a further aspect, the invention may relate to least one computer storage medium comprising computer-executable instructions that, when executed by at least one processor perform a method comprising rendering a user interface. A specification of test plan parameters may be received through the user interface. The test plan parameters may comprise at least a plurality of flow domains, each flow domain identifying a group of pins of at least one device under test accessed during execution of one or more test blocks in a test flow. The test system configuration may be generated based on the test plan parameters. The test system configuration may comprise, for each flow domain, a mapping between a tester site and the group of pins of each of the at least one device under test.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
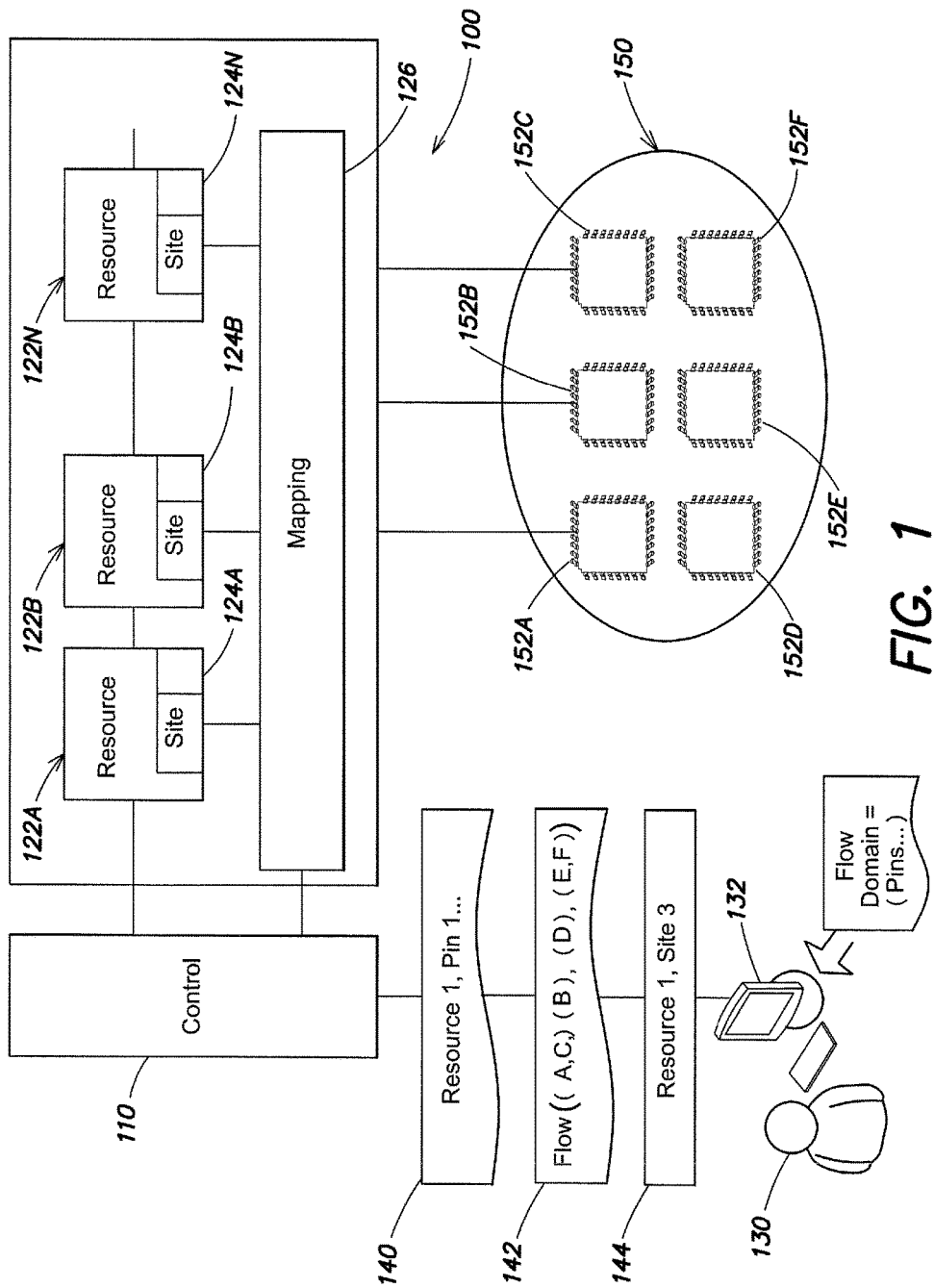
FIG. 1 is a schematic illustration of a test system in which embodiments of the invention may be practiced.

The inventors have recognized and appreciated that, though concurrent testing provides advantages, it introduces complexity in programming and configuring a test system. The inventors also have recognized and appreciated that the complexity of developing test blocks for concurrent testing of multiple devices, each with multiple cores, has resulted in inefficient utilization of tester resources. Similarly, difficulties in configuring the test system to support concurrent testing of multiple cores within the same device, whether or not multiple devices are tested in parallel, has led to inefficient utilization of tester resources.

The inventors further have recognized and appreciated that more efficient usage of tester resources may be achieved by providing a test system with an ability to accept and apply user input indicating groups of pins associated with specific cores on a representative device under test. Here, a "core" may indicate a portion of a semiconductor device created with a reusable design. For example, some semiconductor devices contain processor cores that are implemented based on commercially available designs, which are referred to as cores. However, it should be appreciated that the invention is not limited to testing of multi-core devices designed using commercially available cores. Any suitable functional portion of a semiconductor device, whether or not reusable or commercially procured, may be regarded as a "core" and may be tested as described herein.

Regardless of the specific structures within the semiconductor device under test associated with the groups, each of these groups may define a flow domain, containing the pins used in generating and measuring test signal at all of the pins in the group associated with a sub-flow. An instance of a flow domain may exist for each user site. An automated tool may configure the test system to provide resources in each instance of a flow domain associated with each of a plurality of user sites.

Such a tool may configure the test system by defining a plurality of site regions. Each site region may be a group of one or more tester sites. Each group may be associated with one or more flow domains. Resources may be assigned to site regions such that resources associated with each site region may be used in testing each instance of a flow domain across all of the user sites.

A first portion of the site regions may be flow-domain-specific site regions such that each of the site regions in the first portion may be associated with a flow-domain. Resources in a flow-domain-specific site region provide for testing each instance of the associated flow domain. In some embodiments, there may be a one-to-one relationship between the flow-domain-specific site regions and flow domains.

In some embodiments, an existing tester architecture, which is not designed for testing independent sub-flows, may be adapted for such testing. Such an adaptation may entail providing a mechanism to allocate resources that avoids the need for sharing test and/or device state information across instances of test blocks concurrently executing tests on different cores in the same device under test. In a test system that supports more tester sites than there are user sites, flow-domain-specific site regions may be formed by assigning groups of tester sites to each site region. A tester site within each site region may be associated with a different flow-domain instance. By assigning independently operable resources to each tester-site assigned to a site region, a plurality of test block instances may be concurrently executed such that, within each user site, concurrent test may be conducted on multiple cores.

In some embodiments, having flow-domain-specific site regions allows automated configuration of a test system to support concurrent sub-flows in each of multiple user sites, even for a test program that is not specifically coded for concurrent testing. An automated tool, for example, may generate a mapping between resources that have been assigned to each flow-domain-specific site region and each of the corresponding instances of a flow domain in each of the user sites. Within each of a plurality of user sites, multiple test blocks may be concurrently executed, even without specific coding of the test blocks for concurrent execution.

A second portion of the site regions may include site regions that are not associated in a one-to-one relationship with a flow domain. This second portion of the site regions may include a Global site region. Resources in the Global site region may be associated with any flow domain. Assignment of resources from the global site region may be made instead of or in addition to assignment of resources from a flow-domain-specific site region from the first portion of the site regions.

The Global site region may contain resources that are provided through hardware components that do not support allocation to one of a set of possible tester-sites equal to or greater than the number of tester-sites that are used in creating all of the site regions. Some resources, for example, may not support tester-sites at all or may not support the number of tester sites required to provide, within each site region, a separate tester site for each instance of a flow domain. Providing a Global site region allows these resources to be used during a test. Though, in some embodiments, such a test may be coded to ensure that the same resources, though accessible in multiple flow domains and, possibly, multiple instances of the same flow domain, are not accessed at the same time in inconsistent ways from different flow domains or different instances of the same flow domain. Alternatively or additionally, the Global site region may contain resources that are intended to generate or measure signals applicable to multiple flow domains. For example a resource supplying a fixed power level may be assigned to the Global site region because the fixed power level may be applicable across multiple cores within a semiconductor device being tested.

In some embodiments, resources in the Global site region are not associated with any flow-domain-specific site regions. A test block that accesses resources from the Global site region may be coded or operated to ensure that different executing test block instances do not interfere with each other when attempting to access the same Global resource.

A further site region in the second portion may be a System site region. The System site region may contain all of the resources such that all such resources can be used during a flow. In some embodiments, the System site region may be used for serial testing.

Alternatively or additionally, the test system may recognize commands in a test block that perform functions on a per flow domain instance basis. For example, a user may specify that, upon detecting an error in a test in one flow domain instance, testing on that flow domain instance stop. A user may specify, whether, upon encountering an error in testing one flow domain instance, other testing should continue or be stopped. Testing may continue in other flow domain instances associated with the same user site, for example, to support binning of a particular device under test at that user site.

As another example, a test system may support alarm functions that operate on a site-by-site basis and tools for programming the test system may support commands that control alarms in this way. The alarms may function as in a conventional test system; for example, to signal that the test system hardware is unable to achieve or maintain a programmed level of current or voltage. Alarm commands, for example, may clear or check alarms for each flow domain instance. Such a capability may be provided in a test system that has the ability to clear and check alarms on tester-site by tester-site basis. Alarms associated with a tester-site, which is in turn associated with a flow domain instance, may be cleared immediately preceding initiating a measurement in the flow domain instance. Immediately following a measurement in the flow domain instance, any alarms associated with the tester-site may be checked to ascertain whether an alarm condition occurred while making a measurement in the flow domain instance. Clearing and reading the alarms per tester site, when each tester site is associated with a flow domain instance, may prevent an alarm in one flow domain instance from interfering with tests concurrently being performed in other flow domain instances.

Though, in some scenarios, it may be advantageous for testing in a first flow domain instance to depend on conditions detected in a second flow domain instance. Accordingly, embodiments of the invention may support conditional execution of a test block in one flow domain instance based on an alarm in another flow domain instance. In some embodiments, the test system may limit such conditional processing to scenarios in which the first and second flow domain instances are associated with the same semiconductor device being tested. Though, such a limitation is not a requirement of the invention.

Alternatively or additionally, commands for sharing resources may operate across tester sites in a site region. As one example, an instruction in a test block to serialize use of tester resources in a concurrent test, sometimes called a site loop, may operate across the tester sites in a site region. In this way, the tester sites in a site region can sequentially perform test operations with a serialized resource.

In some embodiments, though, no special programming is required for concurrent test of multiple sub-flows within a device under test. A test block may be written without regard for the fact that other test block instances may be concurrently executing in the same user site. By allocating independent tester resources through flow-domain-specific site regions, each instance of a test block may operate using resources that do not interfere with execution of other test block instances, even if not specifically coded for such operation. As a result, development of test blocks may be separated from the order and combinations in which they will be executed. In some scenarios, a user may use the same test blocks to switch easily between configurations in which the tester blocks are executed concurrently and configurations in which the tester blocks are executed sequentially. Such a capability may be useful, for example, when developing or validating a test program because it will enable a test engineer to quickly identify incorrect test results introduced by concurrent testing or cores.

To use such a tool, a user may provide inputs, either directly or indirectly. Some user inputs may be provided directly through a user interface. Other user inputs may indicate a user selection that in turn dictates applicable data to use in configuring a test system.

User inputs may include inputs conventionally provided to configure a test system to execute a test plan. For example, inputs may specify available test system resources, channels of the tester at which inputs/outputs of those resources can be accessed, a number of user sites and/or a number of pins in a representative device under test to be tested at each site. User inputs may also specify pin information that identifies, for each pin in a representative device under test, resources required for testing the device during each test block of a test program. This per-pin information may include specification of groups of pins that operate together, and may include timing requirements, sometimes specified as a time domain, for testing that group. The per-pin information may be specified in any suitable way, including for example, as a pin map, as is known in the art, which identifies for each pin, groups to which the pin is assigned and a type of the pin. The type of pin, for example, may indicate the type of resources required to test the pin.

Also, flow information may be specified, such as in a flow sheet, that specifies the sub-flows for the flow and, for each sub-flow, an order in which test blocks are to be executed and at which flow step execution of each block should begin. Though, flow information may also be provided through commands, such as may be captured in a script associated with an overall test plan. The script, for example, may include sequential commands, specifying for each flow step, which test blocks are to be executed concurrently during that flow step.

Though, it should be appreciated that some inputs may be derived from others of the inputs or different inputs. As a specific example, the number of user sites may be determined from the same automated tool or a different automated tool that computes, based on tester resources available and tester resources required to execute a test program, the total number of devices that can be tested concurrently. As another example, the assignment of tester resources to specific pins in each user site may be specified as an input or derived automatically.

In addition to these conventional inputs used in configuring a test system to execute a test plan, the user may specify one or more flow domains. This input may be provided in any suitable way. In some embodiments, this input may be specified in the same way that other groups of pins are identified, with a flow domain acting as a special type of pin group. As an example, a user may type into a user interface names of pins for a representative device that are associated with each flow domain. Alternatively, this input could also be supplied by identifying a spread sheet or other data source that includes information from which pins associated with each flow domain can be identified. Though, it is not a requirement that every pin be associated with a flow domain. In some embodiments, for example, a user may specify that some pins are to be tested sequentially (i.e. not while any other flow domain is being tested).

Other inputs may be provided, either directly or indirectly. For example, information on instruments, and whether they support the number of test sites required for a desired level of concurrent test, may be provided. These inputs may be used to assign resources to the Global Site region or to make them available for allocation to flow-domain-specific site regions.

The tool may use this information to determine the appropriate configuration for the test system in executing a test plan. The configuration may determine, for example, a number of tester sites to be used in executing the test plans and which resources are to be assigned to each tester site. These assignments may be made to implement site regions and to associate the site regions with appropriate flow domains. This configuration information may then be used to configure a test system for conducting a test in accordance with a test plan.

In some embodiments, the association of pins with flow domains may apply throughout an entire test plan. Though, it should be appreciated that, at different flow steps in a test plan, different combinations of pins may be used in testing as part of each sub-flow. Accordingly, it is not a requirement that a sub-flow exist during an entire flow. The sub-flows, and associated flow domains and the corresponding assignment of tester resources to sites, may be different at different times during a test plan. For example, a sub-flow may exist only during one flow step such that the configuration of the test system may change at each flow step or at some coarser interval during execution of a test plan.

Turning to FIG. 1, an exemplary test system 100 that may be configured using such a tool is illustrated. Though, it should be recognized that configuration information provided to a test system may be obtained in any suitable way, and need not be generated by an automated tool. The test system 100 may be constructed using hardware components as are known in the art. In this example, test system 100 includes a body enclosing components that can generate and measure multiple test signals. Here, that body is illustrated as tester 120.

Tester 120 houses multiple components for generating and measuring test signals under the control of a test program. The components generating and measuring test signals are here represented generically as "resources." In the example of FIG. 1, resources 122A, 122B . . . 122N are illustrated. In some embodiments, multiple types of resources will be included among the resources 122A, 122B . . . 122N. Each resource may generate and/or measure one or more signals used in a testing function. For example, a resource may be programmed to generate or measure one or more signals that each represents a series of digital values. Another resource, for example, may be programmed to generate an analog signal that varies according to a programmed pattern. Yet other resources may capture analog signals being measured by tester 120. As a further example, other resources may measure RF signals.

The resources may be provided by hardware components, such as instruments as are known in the art. For example, resources may be provided by a combination of digital instruments, analog instruments, RF instruments and any other suitable type of instrument for generating or measuring a signal during testing of a semiconductor device. Some instruments may provide multiple types of resources such that there is not a requirement for a one-to-one relationship between resources and hardware components that implement them. For example, a single instrument may provide a capability to measure a DC voltage or current and also to drive one or more digital pins of a device under test. Though, it should be appreciated that the physical implementation of the resources is not critical to the invention.

Regardless of the number and type of resources within tester 120, the resources may be connected to one or more semiconductor devices under test through one or more components that are here represented schematically as signal delivery interface 126. Such a signal delivery interface may be constructed using techniques as are known in the art. The signal delivery interface 126 may connect input/output ports of the resources to respective pins of a device under test.

It is not a requirement that multiple devices be tested concurrently in accordance with some embodiments. However, in this example, semiconductor devices 152A, 152B . . . 152F are illustrated as being presented for testing by tester 120. The devices under test 152A, 152B . . . 152F can be manipulated as a group because they are coupled to a substrate 150. In the example of FIG. 1, the devices under test 152A, 152B . . . 152F are illustrated as packaged parts. Accordingly, substrate 150 may be a handler interface board or other fixture configured to hold multiple packaged semiconductor devices. In scenarios in which semiconductor devices are tested in other stages of manufacture, the devices under test may be coupled to other types of substrates for convenient handling. For example, semiconductor devices may be tested while joined together as a semiconductor wafer from which the devices are manufactured. In that scenario, substrate 150 may be the wafer itself.

Regardless of the type of substrate 150 used to hold multiple semiconductor devices under test, substrate 150 may be pressed against a portion of tester 120 by a handling device (not shown). Handling devices that can position semiconductor devices for testing by a test system are known in the art, and any suitable handling device may be used.

In some embodiments, substrate 150 may hold more semiconductor devices than can be tested at one time by tester 120. Limitations on the number of devices that can be concurrently tested may arise because of limitations on the resources within tester 120 in comparison to the resources required to run a test program on a device under test. If substrate 150 holds more devices than can be concurrently tested by tester 120, a handling device (not shown) may reposition substrate 150 after a group of devices has been tested. By repositioning substrate 150, further groups of semiconductor devices may be tested. Though test processes performed on a single group of one or more semiconductor devices are described herein, it should be appreciated that, when more semiconductor devices are available for testing than can be tested at once, some or all of the devices may be tested in groups by presenting another group of devices to a test system and repeating those test processes.

In the example of FIG. 1, three semiconductor devices, 152A, 152B, 152C are shown connected to tester 120 simultaneously. Though this example shows multiple devices in each group, for some complex semiconductor devices, each group of semiconductor devices presented for test may contain only a single semiconductor device. Regardless of the number of devices in the group, each of the semiconductor devices 152A, 152B and 152C may be concurrently tested by resources within tester 120 generating and measuring test signals that are coupled to the devices under test. In the simplistic example of FIG. 1, a single connection is shown coupling test signals between tester 120 and each of the devices 152A, 152B and 152C. However, it should be appreciated that hundreds or possibly thousands of test signals may be generated or measured in order to fully test a modern semiconductor device. The numerous connections between tester 120 and each of the semiconductor devices being tested are not shown for simplicity.

Regardless of the number of semiconductor devices to be concurrently tested, a signal delivery interface 126 may couple test signals to be generated or measured between the resources 122A, 122B . . . 122N and the semiconductor devices 152A, 152B and 152C to be concurrently tested. Such a signal delivery interface may be constructed using techniques as are known in the art. Though shown schematically in FIG. 1 as a single component, signal delivery interface 126 may contain multiple layers implemented in multiple separate components that are connected to route signals between the resources and the devices under test.

Those layers, for example, may include a layer having a configuration defined by the construction of tester 120 such that connections may be made to input/output ports of the resources 122A, 122B, . . . 122N. Another portion of the signal delivery interface 126 may have a configuration defined by the semiconductor devices to be tested. The device specific portion of the interface may include multiple probes or other contact mechanism adapted to make connection to test points on the semiconductor devices under test. These test points may be configured based on the layouts of the devices under test to align with specific test points.

Between the tester specific and device specific interface layers, one or more routing layers may be provided within signal delivery interface 126. One or more of these routing layers may be programmable such that, as part of configuring test system 100 to execute a test plan, tester 120 may be configured such that resources capable of generating or measuring test signals to be applied to specific test points on a device under test may be routed from resources capable of generating or measuring such test signals to the specific test points where such test signals are to be applied or measured.

In the example of FIG. 1, test system 100 includes a control component 110. Control component 110 may be a computer or any suitable type of processor that may be programmed to generate control signals to other components of the test system in accordance with a test plan. Control component 110 may control operation of components within tester 120 using techniques as are known in the art, including components configuring tester 120 based on a desired mapping between resources and points are the device-specific side of signal delivery interface 126. For example, control component 110 may generate control signals to signal delivery interface 126 to connect specific resources to specific test points on one or more devices under test.

Additionally, control component 110 may control operations of resources 122A, 122B . . . 122N. Controlling the resources may entail setting one or more operating parameters. The specific operating parameters set by control component 110 are not critical to the invention and may depend on the resources included in test system 100 and/or the test functions specified as part of a test plan. These parameters may be determined using techniques as are known in the art, or in any suitable way. Though, as an example of the types of parameters that may be controlled, control component 110 may specify a voltage level of a test signal to be generated by a particular resource. Alternatively or additionally, control component 110 may specify parameters that control the timing with which signals or patterns of signals are generated. Other parameters that may be specified include frequency or duration of a test signal.

The specific parameters and parameter values specified may depend on the nature of the test to be executed. Inputs specifying a tester configuration may be provided from any suitable source. In the example of FIG. 1, inputs specifying a test system configuration are provided in response to actions by a user 130. User 130 may represent a test engineer, for example, who may be developing a test for a semiconductor device as it is being designed. Though FIG. 1 shows a single, human user, it is not a requirement that a user be a single person. In some scenarios, different portions of the processing described herein may controlled by different people. For example, a test plan may be developed at one time by a test engineer and then executed by an operator to test semiconductor devices at another time, possibly even in a different place using different equipment, to test semiconductor devices as they are being manufactured. Moreover, groups of people may collaborate to perform some or all of the operations described herein such that a "user" need not be a single person. As a specific example, an advantage of the test system operating techniques as described herein is that it allows test blocks, associated with different cores to be independently developed and then combined into flows of varying degrees of concurrency.

Regardless of the number and job functions associated with the user, the user may generate a configuration for the test system as part of a test plan and then load that into the test system for execution of the test plan. In this example, user 130 provides input through a workstation 132, which is coupled to control component 110. In the example illustrated, workstation 132 is shown coupled to control component 110 while user 130 is interacting with workstation 132. It should be appreciated, however, that inputs from user 130 need not be provided to control component 110 in real time. For example, user 130 may operate workstation 132 to generate information for configuring control component 110. This configuration information may be stored and later loaded into control component 110. Moreover, it is not a requirement that inputs specifying a test system configuration be provided directly in response to user input. The configuration information, for example, may be generated by execution of one or more computerized tools or in any other suitable way.

Workstation 132 may be any suitable computing device. For example, workstation 132 may be a desktop computer or any computing device programmed to execute a tool for configuring test system 100 using techniques as described herein. Execution of such a tool may result in generating configuration commands, such as configuration commands 140, 142 and 144 that may be transferred to control component 110. These configuration commands may configure control component 110 to configure the resources 122A, 122B, . . . 122N and signal delivery interface 126 for testing of one or more semiconductor devices under test at a time. Though it should be appreciated that control component 110 may be the same computing device as workstation 132.

A handling device (not shown) may be configured with corresponding configuration information such that it will present at one time the number of semiconductor devices that tester 120 is configured to test. In the example of FIG. 1, tester 120 is shown making connections to three semiconductor devices, semiconductor devices 152A, 152B and 152C. Each of these semiconductor devices may have the same configuration and may be said to be installed in a user site of test system 100. Each user site may represent a location where a semiconductor device under test is presented to tester 120 for testing.

Generally, in a semiconductor manufacturing facility, multiple copies of a semiconductor device are manufactured at one time. Accordingly, multiple copies of a semiconductor device may be tested as part of that manufacturing process. The semiconductor devices presented at each of the user sites may therefore be the same.

To support testing of multiple devices of the same type, conventional test systems are designed to support tester sites. In a conventional test operation, the test system may be configured such that a tester site corresponds to each user site where a device under test is presented for testing. To support concurrent testing of devices at multiple user sites, the test system may support executing an instance of a test program at each tester site. In this way, an instance of a test program can be concurrently run at each of multiple user sites.

FIG. 1 illustrates an approach by which tester sites may be used to configure a test system for concurrently executing test instances at multiple user sites. As shown, each of the resources 122A, 122B, . . . 122N contains programmable hardware, such as registers 124A, 124B, . . . 124N. Values written into registers 124A, 124B, . . . 124N specify one or more tester sites with which each of the resources has been associated. By mapping resources associated with a specific tester site to a specific user site, the test system may be operated to execute multiple instances of the test program for a semiconductor device under test.

Operation of the tester sites may be controlled using techniques as are known in the art. Briefly, however, control component 110 may access a program, written to test a representative device under test to determine required actions, such as generating or measuring a specific signal, to be performed during each of multiple program steps. Control component 110 may then issue commands to resources within tester 120 associated with the multiple tester sites that are mapped to the user sites at which devices under test are presented to tester 120. Each command may setup a resource, control the resource to generate a test signal, control the resource to take a measurement or trigger any other suitable test function.

Such commands may be provided in any suitable way. The specific mechanism by which a control component provides commands to a resource may depend on the construction of the hardware instruments providing the resources and/or other factors, including the architecture of the test system. In some scenarios, a command directed to a resource may incorporate an address specifically identifying the resource. In other scenarios, the control component may first identify tester sites to which a command applies. When the command is subsequently issued, each resource having been assigned to the identified tester sites may respond to the command.

In some scenarios, a separate copy of a resource may be provided for each instance of a test program being executed at a user site. Using separate resources allows each instance of the test program to follow a different flow, depending on the results of testing of the semiconductor device being tested at a specific user site. For example, if, as a result of measurements made on three semiconductor devices being concurrently tested, it is determined that one of the semiconductor devices if faulty, the flow of the test instance for that semiconductor device may be altered while allowing the test flow to continue unaltered for the other semiconductor devices under test. The test flow may be altered in any suitable way, including by suspending testing for the faulty device.

Though, it is not a requirement that every resource used in testing at multiple user sites be independent. In some scenarios, for example, a resource providing a voltage level acting as a power supply may be connected to multiple user sites. Similarly, other resources that operate the same in all user sites, regardless of any conditional processing, may be coupled to more than one user site.

Though, providing a test system that can be configured to match resources to user sites for concurrent test of multiple semiconductor devices is useful, the inventors have recognized and appreciated that substantial advantages in testing semiconductor devices may be achieved, in a very simple way, by using those capabilities in other testing scenarios. One such scenario is illustrated in FIG. 2.

Figure 2:
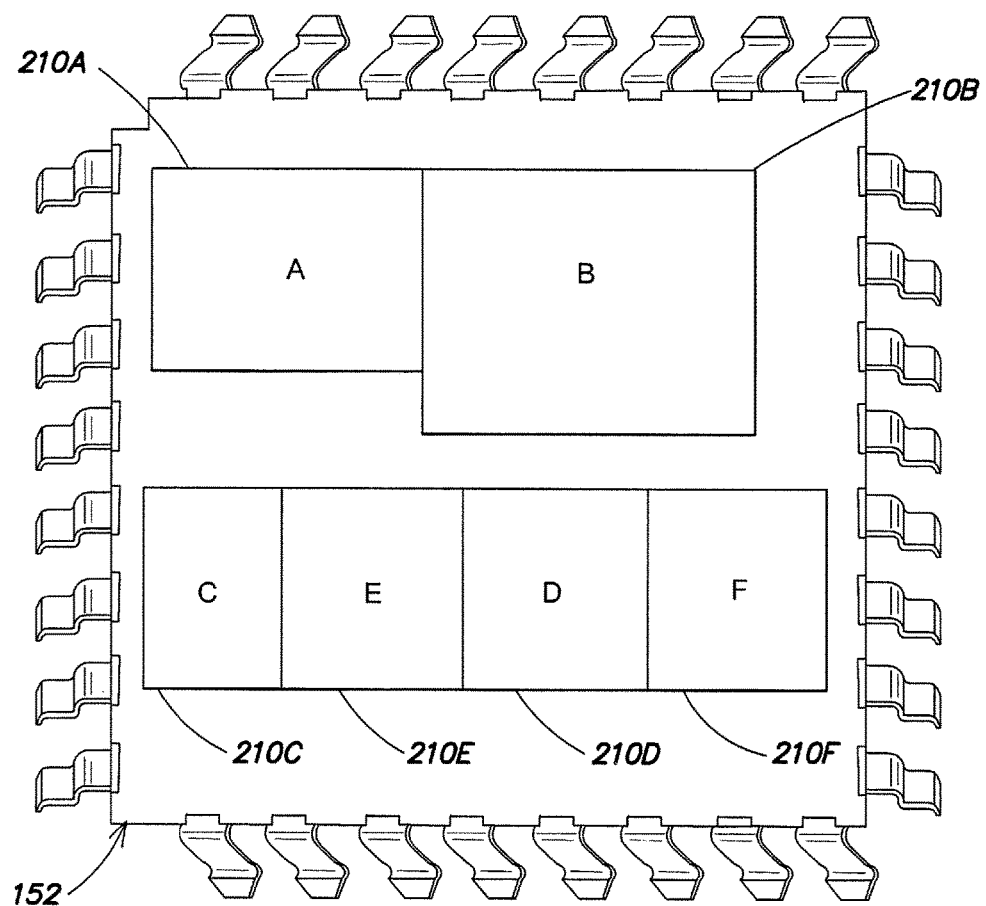
FIG. 2 is a schematic illustration of a semiconductor device with multiple cores that may be concurrently tested according to some embodiments of the invention.

FIG. 2 illustrates, conceptually, a semiconductor device 152 that may be tested by a test system. Semiconductor device 152 may be a semiconductor device as is known in the art. In this example, semiconductor device 152 is illustrated as a packaged semiconductor device. Though, as noted above, semiconductor devices may be tested in any suitable form at any suitable stage in their manufacture. For example, techniques as described herein may be applied to semiconductor devices while still unpackaged and part of a semiconductor wafer.

Regardless of the form in which semiconductor device 152 is tested, semiconductor device 152 may contain multiple functional portions, or "cores." In the example of FIG. 2, device 152 is shown to contain cores 210A, 210B, 210C, 210D, 210E and 210F. The specific function of each of the cores is not critical to the invention, and each of the cores 210A, . . . 210F may represent any suitable type of core, whether now known or hereafter developed.

Applicants have recognized and appreciated that substantial advantages may be achieved in developing a test program for semiconductor device 152 by developing test blocks associated with each of the cores. Further advantages may be achieved by providing a semiconductor device test system that may be readily programmed to execute those test blocks. Moreover, the inventors have recognized and appreciated that in many scenarios it would be desirable to allow a user to specify a flow for a test assembled from those test blocks, regardless of whether the test blocks are included sequentially or concurrently in the test flow. Such a capability, for example, may allow an entity developing a semiconductor device to develop a test program for the semiconductor device by having one or more individuals or groups of programmers develop test blocks independently. These test blocks may then be combined into a test flow. Moreover, the combination of the test blocks may be varied to achieve different purposes at different times.

Figure 3:
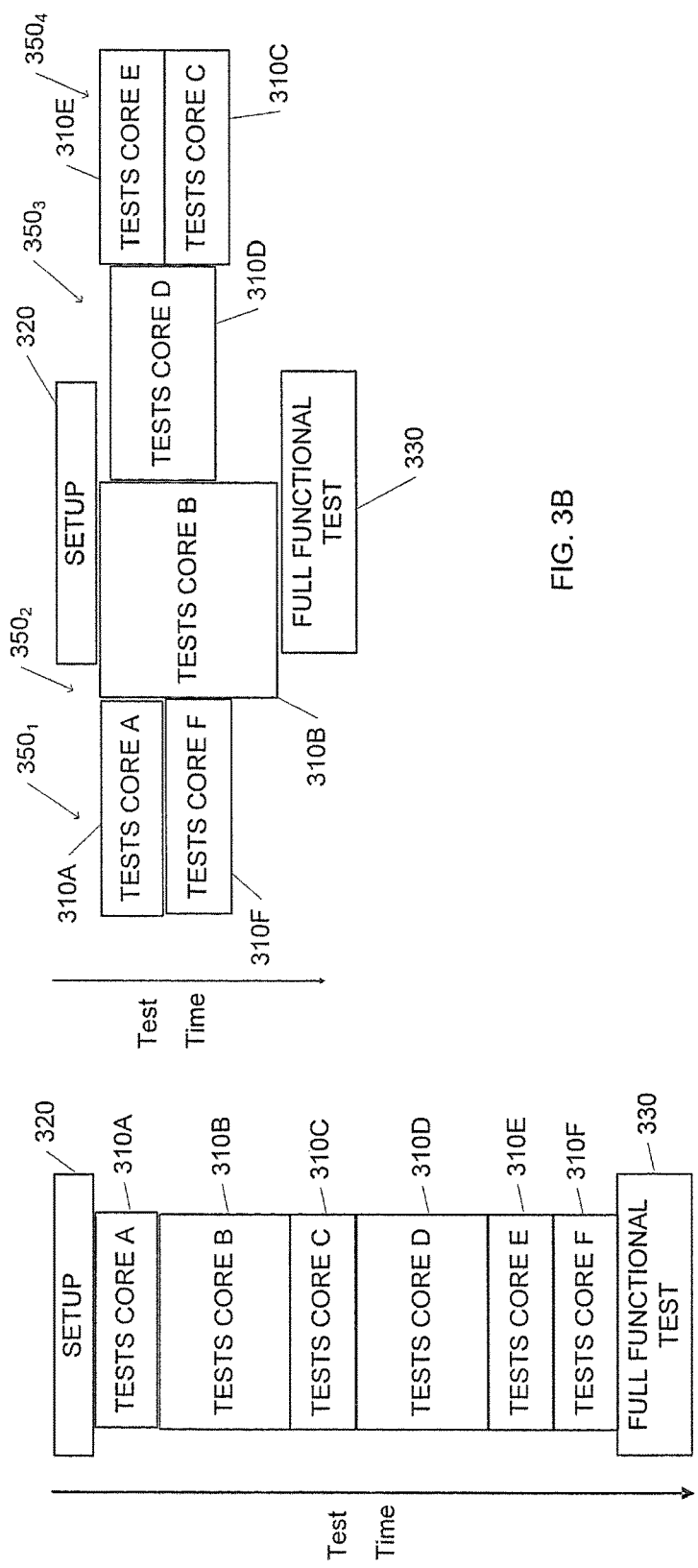
FIG. 3A is a schematic illustration of a sequential test flow.
FIG. 3B is a schematic illustration of a flow with multiple sub-flows that may execute concurrently.

FIGS. 3A and 3B illustrate an example of the flexibility that may be provided with this approach. FIG. 3A illustrates an example of a sequential flow for a test program that may test semiconductor device 152. In the flow of FIG. 3A, multiple test blocks 310A, 310B, 310C, 310D, 310E and 310F are executed. In this example, each of the test blocks 310A, . . . 310F has been developed independently to test a core of the cores 210A, . . . 210F (FIG. 2).

As shown in FIG. 3A, these test blocks may be executed sequentially, and may precede and/or follow other testing functions. In this example, test blocks 310A, . . . 310F are executed following execution of a set up block 320. The set up block 320 may program resources that power on the device, clear or set memory components on the device or otherwise place the device in a condition for testing. The flow illustrated in FIG. 3A also includes a full functional test block 330. Functional block test 330 may specify test actions that will verify operations of a device under test that involve interaction between cores. In the flow illustrated in FIG. 3A, the full functional test block 330 is executed after each of the cores is tested sequentially. Including full functional test block 330 at this point in the test flow may avoid the need for executing full functional test if one or more of the cores is determined to be faulty. If all of the test blocks 310A, . . . 310F execute successfully, confirming operation of the cores, the full functional tests in block 330 testing interactions between these cores may be more simply implemented than if test block 330 needed to be programmed to account for possible erroneous operating conditions with any of the individual cores. Though, it should be appreciated that the location within the test flow of functional test block 330 is not critical to the invention.

FIG. 3B shows an alternative flow that may be used to execute the test for device under test 152. As is the case with the test flow of FIG. 3A, the test flow of FIG. 3B begins with a set up block 320 and ends with a full functional test block 330. However, unlike the test flow of FIG. 3A, the test flow of FIG. 3B includes multiple sub-flows.

In the flow of FIG. 3B, the sub-flows, execute concurrently. In this example, four sub-flows, sub-flows $350_1$, $350_2$, $350_3$, and $350_4$ are illustrated. Sub-flow $350_1$ contains test blocks 310A and 310F. The test blocks 310A and 310F are executed sequentially in sub-flow $350_1$. Sub-flow $350_2$ includes test block 350B. Sub-flow $350_3$ includes test block 310D. Sub-flow $350_4$ includes test blocks 310E and 310C. As illustrated in FIG. 3B, test block 310E and 310C are executed sequentially within sub-flow $350_4$.

Each of the sub-flows has a shorter execution time than the flow of FIG. 3A. Though the same amount of testing is performed, the overall test time is reduced relative to the overall test time for the flow of FIG. 3A. Accordingly, FIG. 3A may represent testing to be performed during development of a device. In contrast, FIG. 3B may illustrate testing that may be performed during manufacturing of a device where faster execution time is desired. During development of a device and/or a test program, a test engineer may desire to execute test blocks sequentially. Sequential execution, for example, may facilitate development of the test program and/or debugging of the device under test by allowing a test engineer to focus on smaller portions of the device at a time. On the other hand, during a manufacturing operation, it may be desirable for a test program to execute as rapidly as possible. Accordingly, in that scenario, it may be desirable to execute a test program in as many sub-flows as possible, each executing in as short amount of time as possible.

Considering FIGS. 3A and 3B together reveals that there are scenarios in which it may be useful to rearrange test blocks to provide more or less concurrency during a test. FIG. 3B provides one example of a concurrent test flow. Many other combinations of test blocks in various sub-flows could be created. The specific combinations that are possible may depend both on the characteristics of the device under test and interdependence of structures of the device under test to be accessed by a test program being executed.

Various factors may limit the number of concurrent sub-flows. Some limitations may be derived from the configuration of the device under test. In some scenarios, some test blocks may not be executed concurrently because the associated cores that they test cannot be operated completely independently. For example, core 210A may have outputs coupled to inputs of core 2100 (FIG. 2). In this scenario, it may not be possible to specify test conditions at the output of core 210A while simultaneously specifying test conditions at the input of core 210C. As a result, test block 310A may not execute concurrently with test block 310C.

FIG. 3B illustrates a concurrent flow in which this operation is achieved. Specifically, test block 310A is executed in sub-flow $350_1$ at a first time. Test block 310C, though executed in sub-flow $350_4$ that executes concurrently with sub-flow $350_1$ is ordered in time such that test block 310C will execute after test block 310A is executed. Though, executing the test illustrated in FIG. 3B in six sub-flows would not be possible.

In some embodiments, availability of independently operable resources may limit the number of sub-flows. For example, a digital test instrument may provide as a resource eight digital signals. Though the instrument may allow a value to be independently specified on each of these lines, a constraint on the instrument may require that all eight signal lines change state only on the edges of a common clock signal. Accordingly, though eight digital signals may be provided, the eight signals may not be arbitrarily allocated in different sub-flows in which signal transitions are timed relative to different clocks. In that scenario, a degree of concurrency may be limited by the number of independently operating resources available to assign to each sub-flow.

The number of sub-flows that is possible also may depend on other factors, such as the amount of resources available in a test system. In some embodiments, the test system may be configured such that resources assigned to perform testing in each sub-flow are independent of the resources in the other test flows. Resource usage may be of particular concern when multiple devices are tested concurrently.

These and possibly other constraints may be considered to determine the number of concurrent sub-flows in a test flow. A test engineer or other user of a test system may determine the number of sub-flows in a test flow in any suitable way. Likewise, the specific test blocks to include in each sub-flow may be determined in any suitable way. In some embodiments, known simulation tools or other programming tools may aid a user determine the number of sub-flows and the test blocks executed in each sub-flow. Such a tool, for example, may aid a user in identifying a concurrent test flow that minimizes test execution time. However, the specific mechanism by which a concurrent test flow is developed is not critical to the invention and any suitable test flow may be executed.

Though FIGS. 3A and 3B each illustrate one flow instance, when multiple devices are tested concurrently at multiple user sites, there may be a separate flow instance for each user site and resources must be allocated for each flow instance.

In the embodiment illustrated in FIG. 3B, independent resources are allocated to each of the sub-flows $350_1$ . . . $350_4$. In embodiments in which there are multiple flow instances associated with multiple user sites, each of the sub-flow instances may be allocated independent resources, too.

Accordingly, the test flow may take on various degrees of concurrency. The test flow may be fully sequential as illustrated in FIG. 3A or fully concurrent as illustrated in FIG. 3B or partially concurrent and partially sequential, which, though not illustrated, would entail intervals during which multiple sub-flows are executed concurrently and other intervals during which a single sub-flow is executing. The inventors have recognized and appreciated benefits of providing a technique for adapting a test system, such as shown in FIG. 1, to operate in a manner that allows a user to easily configure the test system to support any desired degree of concurrency of test execution.

Figure 4:
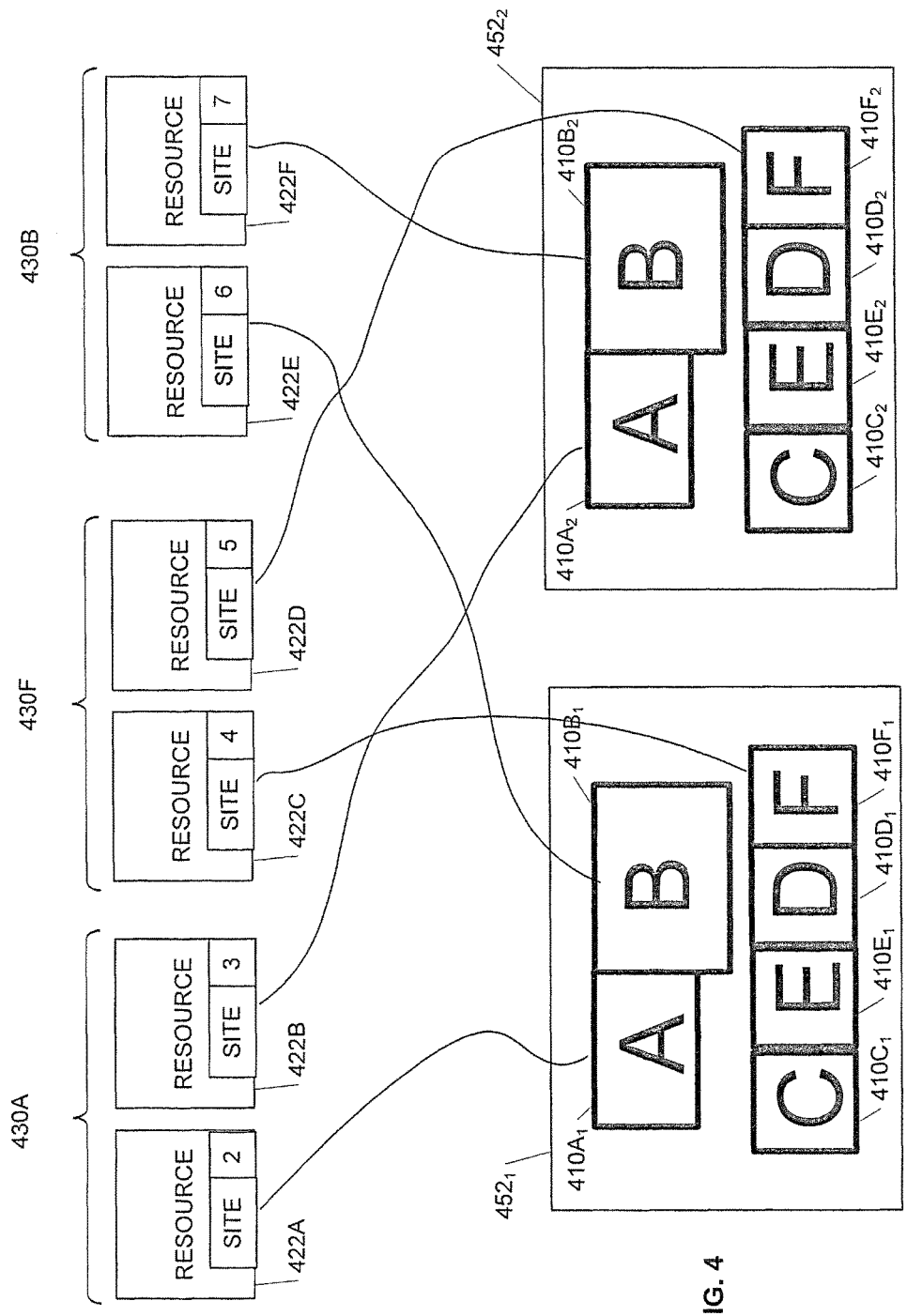
FIG. 4 is a schematic illustration of a configuration of a test system for concurrent testing multiple semiconductor devices, each with multiple cores.

FIG. 4 schematically illustrates the manner in which tester sites within a test system may be applied to configure a test system to execute a test flow with any desired degree of concurrency. FIG. 4 schematically illustrates resources, such as resources 422A, 422B, 422C, 422D, 422E and 422F, which may be within a test system as is known in the art. In the scenario illustrated in FIG. 4, the test system is configured to perform a test across two user sites. Accordingly, two semiconductor devices $452_1$ and $452_2$ are illustrated. In this example, each semiconductor device under test has six cores designated for independent testing.

Each of cores $410A_1$, $410B_1$, $410C_1$, $410E_1$, $410D_1$ and $410F_1$ may have a test block associated with it. The corresponding cores $410A_2$, $410B_2$, $410C_2$, $410D_2$, $410E_2$ and $410F_2$ in semiconductor device $452_2$ may be similarly associated with the same test blocks. Though, in testing each of devices $452_1$ and $452_2$, a different instance of each test block may be executed to test the cores in each of the semiconductor devices $452_1$ and $452_2$.

In the example illustrated in FIG. 4, three sub-flows are being executed concurrently. In this example, the resources of the test system executing the test on devices $452_1$ and $452_2$ have been partitioned into site regions. Each of the site regions may be associated with a sub-flow in a test flow. In this example, site regions 430A, 430F and 430B are illustrated. Site region 430A contains resources 422A and 422B. As is illustrated schematically, resource 422A is coupled to core $410A_1$ and resource 422B is coupled to core $410A_2$. This coupling may be achieved as is known in the art, including by programming a mapping within a signal delivery interface, such as signal delivery interface 126 (FIG. 1). In this example, core $410A_1$ and core $410A_2$ are tested during a first of the three sub-flows. Accordingly, site region 430A is providing resources for testing each instance of the first sub-flow.

Similarly, the resources in site region 430F may be coupled to instances of cores of the devices at each user site that are to be tested during the second sub-flow. In this example, the cores tested during the second sub-flow include cores $410F_1$ and $410F_2$. Each of these cores is tested as part of a separate instance of the second sub-flow and may be tested with a separate instance of a test block, such as test block 310F (FIG. 3A).

Similarly, site region 430B contains resources used for testing cores as part of a third sub-flow. In this example, cores $410B_1$ and $410B_2$ are tested in separate instances of the third sub-flow. In this example, cores $410B_1$ and $410B_2$ represent different instances of the same core and may be tested using different instances of the same test block. In this example, resource 422E is shown coupled to core $410B_1$ and resource 422F is shown coupled to core $410B_2$.

It should be appreciated that FIG. 4 is a simplified representation of configuration of a test system. For example, a single connection is shown between each resource and a core to be tested. Each core may have multiple test points such that multiple signals are coupled between one or more resources and the core for testing. Further, additional cores, such as $410C_1$, $410D_1$ and $410E_1$, $410C_2$, $410D_2$ and $410E_2$ are not illustrated as connected to any resource. For complete testing of semiconductor devices $452_1$ and $452_2$, each of these cores may be similarly coupled to resources for testing.

These cores may be coupled to resources that are allocated to one or more of site regions 430A, 430F or 430B, based on the sub-flow in which these cores are to be tested. For example, core $410C_1$ may be tested as part of the same sub-flow as core $410A_1$. In that scenario, cores $410C_1$ and $410C_2$ may be coupled to resources in site region 430A. Likewise, cores $410E_1$ and $410E_2$ may be tested during the same sub-flow as cores $410B_1$ and $410B_2$. Accordingly, though not shown in FIG. 4, cores $410E_1$ and $410E_2$ may be coupled to resources within site region 430B. Further, cores $410D_1$ and $410D_2$ may be tested during the same sub-flow as cores $410F_1$ and $410F_2$. In that scenario, cores $410D_1$ and $410D_2$ may be coupled to resources in site region 430F.

However, from the simple illustration in FIG. 4, it can be seen that each site region is associated with a sub-flow of a concurrent flow. The inventors have recognized and appreciated that site regions, as conceptually illustrated in FIG. 4, may be created by using tester site capabilities supported by test systems as are known in the art. Different tester sites may be assigned to each site region, even though resources in the different site regions may be used in testing portions of the same semiconductor device in the same user site.

Associating resources with tester sites assigned to site regions in this fashion provides a mechanism to control resources to operate in a test flow, regardless of the number of sub-flows that it has.

The capability to associate tester resources with tester sites may be further used to associate resources with different sub-flow instances. For example, site region 430A is created by assigning resources to tester site 2 and tester site 3. In this example, resources, such as resource 422A, assigned to tester site 2 are allocated for executing test blocks as part of a first instance of a first sub-flow. Resources, such as resource 422B, assigned to tester site 3 are allocated for executing one or more test blocks in a second instance of the first sub-flow.

Similarly, resources assigned to tester site 4, such as resource 422C, are allocated for executing one or more test blocks in a first instance of a second sub-flow. Resources, such as resource 422D, assigned to tester site 5 may be assigned for executing test blocks in a second instance of a second sub-flow. Resources, such as resource 422E, assigned to tester site 6 may be allocated for executing test blocks in a first instance of a third sub-flow. Resources, such as resource 422F, assigned to tester site 7 may be allocated for executing test blocks in a second instance of the third sub-flow.

In this way, tester site assignments are used to associate different, and in some embodiments independent, resources with different sub-flows of a test flow. Tester site assignments are also used to differentiate between instances of the sub-flow. Using known programming techniques, independent resources may be associated with each tester site, even though the resources may be used to test portions of a device at the same user site. For example, tester site 2, tester site 4 and tester site 6 are all assigned for testing a device, such as device $452_1$, at a single user site. However, by using tester sites in this way, known test system configuration techniques that assign independent resources to different user sites may be applied, which will result in assignment of independent tester resources for testing in different sub-flows of an overall test flow. In the embodiment in which different test blocks, each associated with a different type of core, are executed within the different sub-flows, application of independent tester resources in different tester sites results in allocation of independent tester resources for testing each core on the same semiconductor device under test.

Even if other test blocks are executed within each test flow, using different tester sites for each sub-flow may result in any concurrently executing instances of different test blocks being allocated independent tester resources. Said another way, allocating tester resources in this fashion ensures that, regardless of the degree of concurrency specified for a test flow, each instance of a test block can be executed with independent resources, unless specifically programmed to share resources.

To enable allocation of tester resources in this fashion, a test system may be configured based on user inputs that specify flow domains, which are then associated with site regions of the type illustrated in FIG. 4. The test system may then select resources in the appropriate site region to execute test functions in the corresponding flow domain.

To define a flow domain, input, which may be provided directly or indirectly from a user, may specify a group of pins accessed during a sub-flow. In embodiments in which one or more test blocks, designed to test one or more cores, are executed in a sub-flow, the flow domain for that sub-flow may include all of the pins associated with all of the cores tested during that sub-flow.

In the example of FIG. 4 in which cores 210A and 210C (FIG. 2) are tested during a first sub-flow, a first flow domain may be specified by user input identifying the pins of semiconductor device 152 used for test access during execution of test blocks designed to test cores 210A and 210C. Similarly, when cores 210B and 210E are tested during a second sub-flow, a second flow domain may be designated by identifying the pins in cores 210B and 210E that are accessed during execution of test blocks designed to test cores 210B and 210E. Similarly, when test blocks designed to test cores 210D and 210F are executed during a third sub-flow, a third flow domain may be specified as defying a third flow domain.

The input specifying the pins in each flow domain may be provided in relation to a representative device under test or in any other suitable way. As one example, it is known in the art of programming test systems to specify groups of pins. Groups of pins may be specified for any number of scenarios, including to apply common timing or other common operations to the pins in the group. The techniques used to specify groups of pins in these or other scenarios may be used to identify groups of pins forming flow domains.

Regardless of the manner in which the groups are identified, once a group of pins has been identified for a representative device, the groupings may be applied at each site to identify instances of each of the flow domains. Based on these identified flow domain instances, different tester sites may be associated with each flow domain instance. In the example illustrated in FIG. 4, a single tester site is associated with each flow domain instance. However, there is no requirement that a flow domain instance be associated with a single tester site. For example, multiple tester sites may be associated with each flow domain instance. Regardless, the association of tester sites with flow domains may be made through the flow-domain-specific site regions illustrated in FIG. 4.

Such an association enables independent resources to be automatically selected for each sub-flow instance, using known semiconductor test system programming techniques that select independent resources for different tester sites. These capabilities are used to provide a mechanism for executing a test program in which multiple different test blocks can be executed concurrently, even when the test program is not specifically written for concurrent execution. As shown, controlling resources by site regions allows independently developed and independently operating test blocks to be controlled concurrently.

In the example of FIG. 4, test block 310A associated with site region 430A may operate on a first type core by, when executing that test block, using resources that have been assigned to the sites of site region 430A. In similar fashion, test block 310F may operate on a second type core by, when executing that test block, using resources that have been assigned to the sites of site region 430F. Also, test block 310E may operate on a third type core by, when executing that test block, using resources that have been assigned to the sites of site region 430B.

Figure 5:
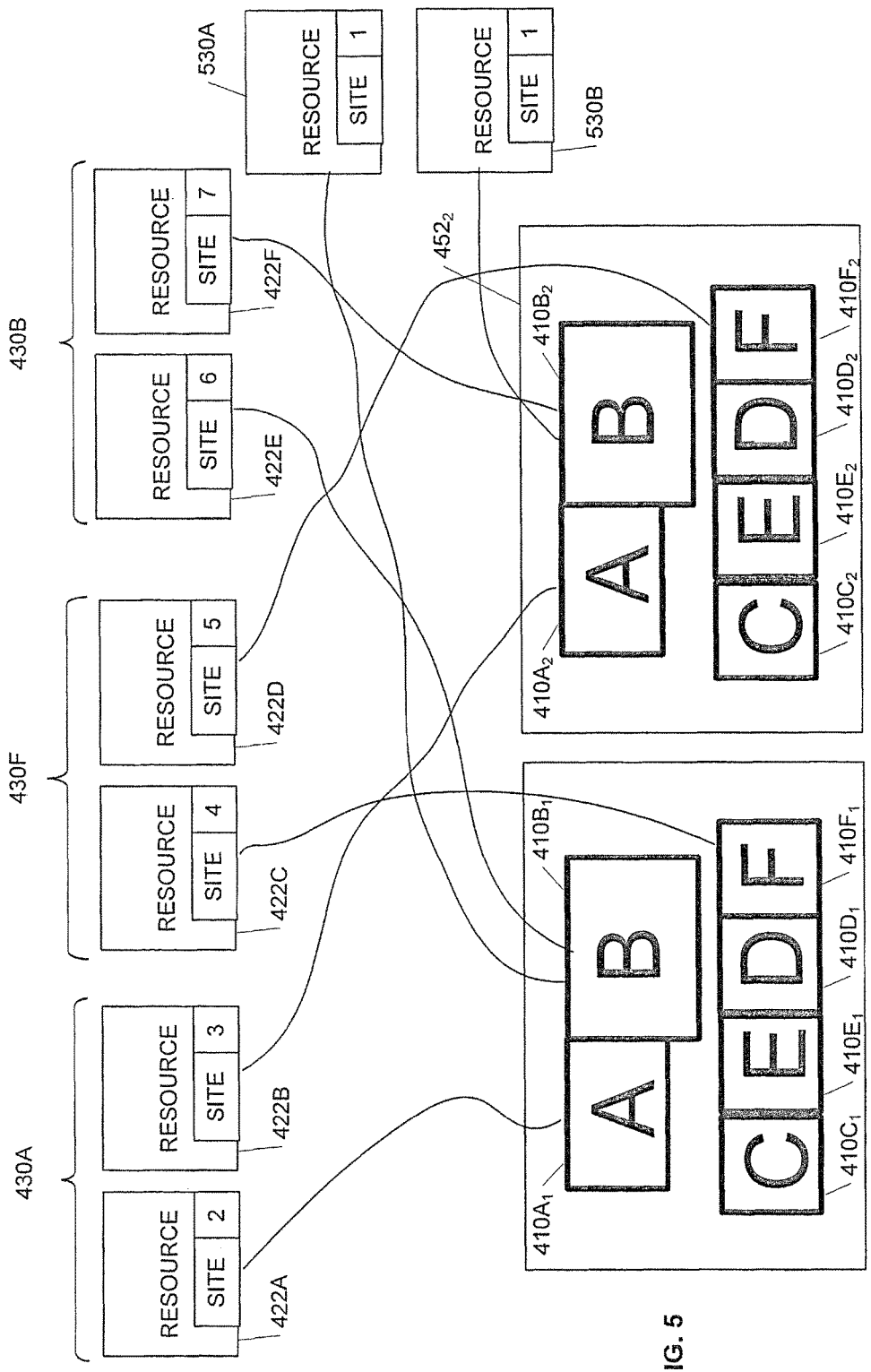
FIG. 5 is a schematic illustration of an alternative configuration of a test system for concurrent testing multiple semiconductor devices, each with multiple cores.

As noted above, automated assignment of resources to site regions may be done to ensure that the resources assigned to each site region are independent. Though, there may be scenarios in which complete independent of resources in each sub-flow instance is not desired. Some dependency between resources in sub-flows may be desired. For example, when a test function requires interaction between cores or there are insufficient resources to execute a test plan with as high a degree of concurrency as desired. Turning to FIG. 5, an alternative operating scenario is illustrated in which a second portion of the site regions are not uniquely associated with a flow domain. FIG. 5 illustrates a test system configured as in FIG. 4 with three flow domain specific site regions 430A, 430F and 430B. The test system is configured such that resources within each of these site regions are allocated for executing test blocks associated with different flow domains. The scenario in FIG. 5 differs from that in FIG. 4 in that the test system illustrated in FIG. 5 includes an additional site region that is not uniquely associated with a flow domain.

Resources 530A and 530B represent a global site region. In this example, the global site region has been implemented by assigning resources in the global site region to tester site 1. Tester site 1 represents a tester site that is not used to assign resources to any of the flow domain specific site regions 430A, 430F or 430B. In the embodiment illustrated, membership in the global site region is defined by the user's definition of a global flow domain. A user cannot associate the global flow domain with any subflow. Its use is implied and by definition global to all concurrent subflows. Though, it should be appreciated that in other embodiments, the global site region may be defined in any other suitable way.

In contrast to the assignment of resources through flow domain specific site regions such as 430A, 430F and 430B, the resources in the global site region are not associated in a one-to-one relationship with any flow domain. Rather, the resources in the global site region, represented in FIG. 5 by resources 530A and 530B, may be accessed from any flow domain. These resources may be accessed from a test block executing in the flow domain using conventional test system programming techniques. Though, in contrast to resources in the flow domain specific site regions 430A, 430F and 430B, which may be assigned by a tool aiding in the configuration of a test system in such a way that independent resources are assured regardless of the degree of concurrency of the test flow, conflicts may arise if resources assigned to the global site region are accessed for more than one test block that is concurrently executing. Accordingly, test programs accessing resources assigned to a global site region may be written to avoid such conflicts. Such conflict avoidance may be performed in accordance with techniques that are currently used to program test systems that do not implement flow domain specific site regions.

Any suitable resources may be assigned to the global site region for any suitable reason. The reasons may include, for example, limitations on the functionality of the resources. As an example of a limitation of a resource, a resource may be part of an instrument that cannot be programmed to operate as part of a tester site or cannot be programmed to operate with the number of tester sites that are in use to support all of the site regions in use. For example, some test systems may support up to 512 tester sites, but some instruments may support only 32 tester sites.

Another reason that resources may be assigned to a global site region may be scarcity of resources such that, in order to test a suitable number of devices concurrently, certain scarce resources must be shared among flow domains. As an example of a scarce resource, a tester may be equipped with a single instrument to generate an RF signal, which is needed to test different cores on one device or multiple devices in different user sites, such that the resources is needed in different flow domain instances. In this scenario, a user may structure a test program to apply an RF signal from the instrument in different flow domain instances at different times during a test.

FIG. 5 illustrates a scenario in which resources in the global site region are assigned to the same tester site. It should be appreciated that such a site assignment is not a requirement of the invention. In some scenarios, when testing multiple user sites as illustrated in FIG. 5, resources in the global site region may be assigned to tester sites such that there is a unique tester site for each unique user site. Such a configuration may allow the user sites to be tested independently or with some degree of independence. Accordingly, it should be appreciated that FIG. 5 is illustrative and not limiting of the implementation of a global site region.

By providing both flow domain specific site regions and a global site region, substantial flexibility can be achieved in programming the test system. Yet, the system may be readily configured to execute test programs with any degree of concurrency using an automated tool that assigns tester sites to flow domain specific site regions. To use resources in the global site region as well in the flow domain specific site regions, a user may associate specific tester sites in the flow-domain-specific site regions with pins in flow domain instances such that independently operating resources in the flow domain specific site regions are automatically selected to access pins in their respective flow domains. In addition, the global site region may be associated with any flow domain instance that contains pins that are accessed by a resource in the global site region during a test.

Figure 6:
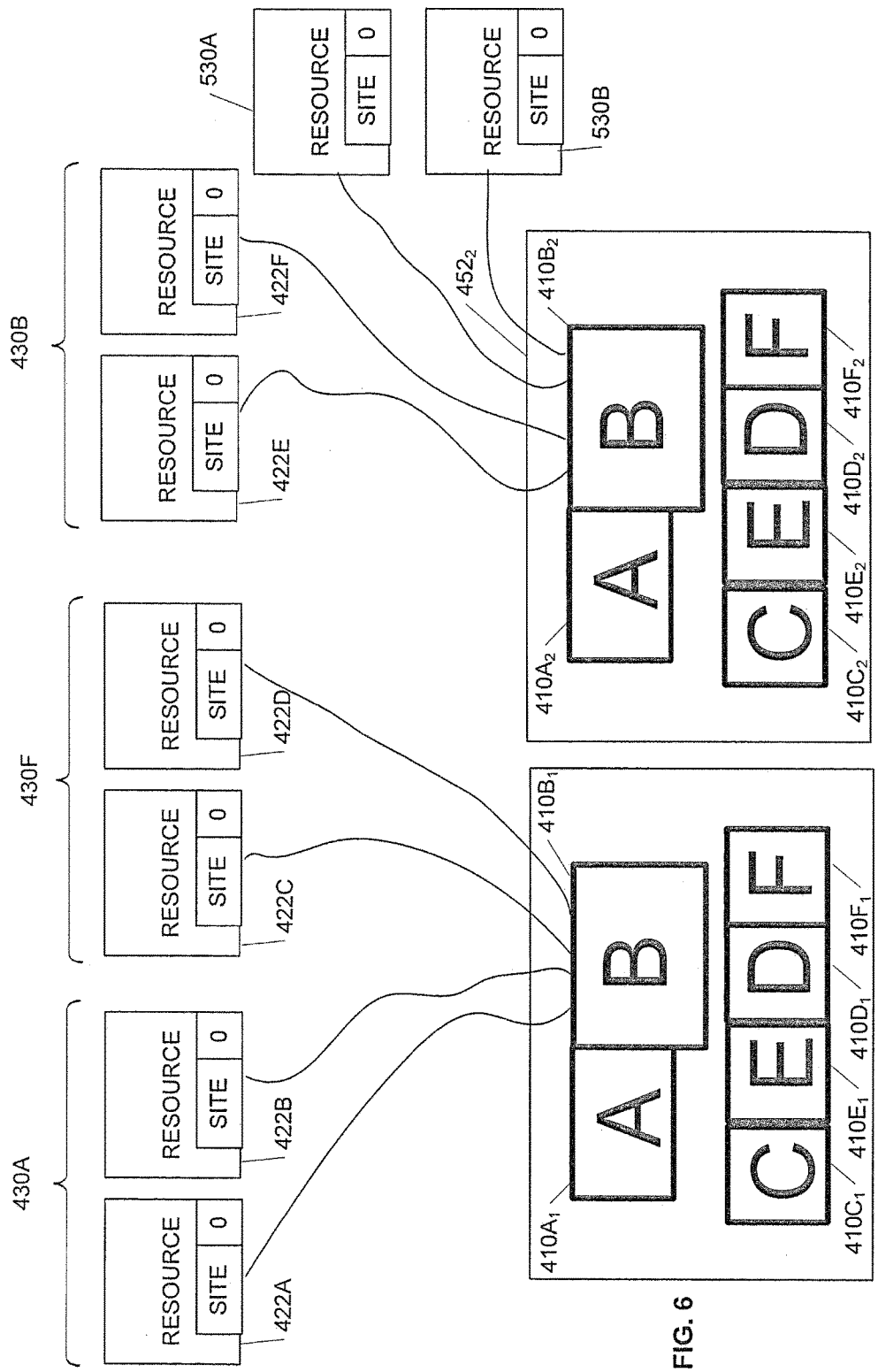
FIG. 6 is a schematic illustration of a further alternative configuration of a test system concurrent testing multiple semiconductor devices, each with multiple cores.

FIG. 6 shows a further type of site region that may be implemented in a test system to provide greater flexibility. FIG. 6 illustrates that, in addition to flow domain specific site regions and a global site region, a test system may be configured with a system site region. In the example of FIG. 6, the system site region is defined using tester site 0. In the embodiment illustrated, all resources are included in the system site region and may be accessed through tester site 0. Though, it should be appreciated that any suitable designation for the system site region may be used. As a specific example, the system site region may be associated with multiple tester sites, such as tester sites numbered from zero to an upper limit which may be based on the number of user sites minus 1. Providing a system site region is an example of a mechanism by which any test block may be coded to access any resource in the system. For example, during serial testing in which cores $410B_1$ and $410B_2$ are tested, it may be desirable to access any number of resources as part of testing a core. Though, because in a sequential flow there is no risk of conflict between resource usage in different test blocks, test blocks may be executed sequentially in a flow without use of flow domain specific site regions.

This flexibility, in the described embodiment, may be provided by configuring some or all of the resources to operate as part of multiple tester sites. For example, in scenarios in which the system site region is assigned tester site 0, every resource may be assigned to site 0. Each tester resource that may be used as part of executing a test program associated with a flow-domain-specific site region and/or to the global site region may be assigned an additional tester site. The additional tester site may represent the global site region or may represent a tester site that is assigned to a flow domain specific site region. In this way, substantial flexibility may be achieved in configuring the resources for executing test programs while still obtaining the benefits of using tester sites to avoid conflicts between resources during concurrent testing.

Figure 7:
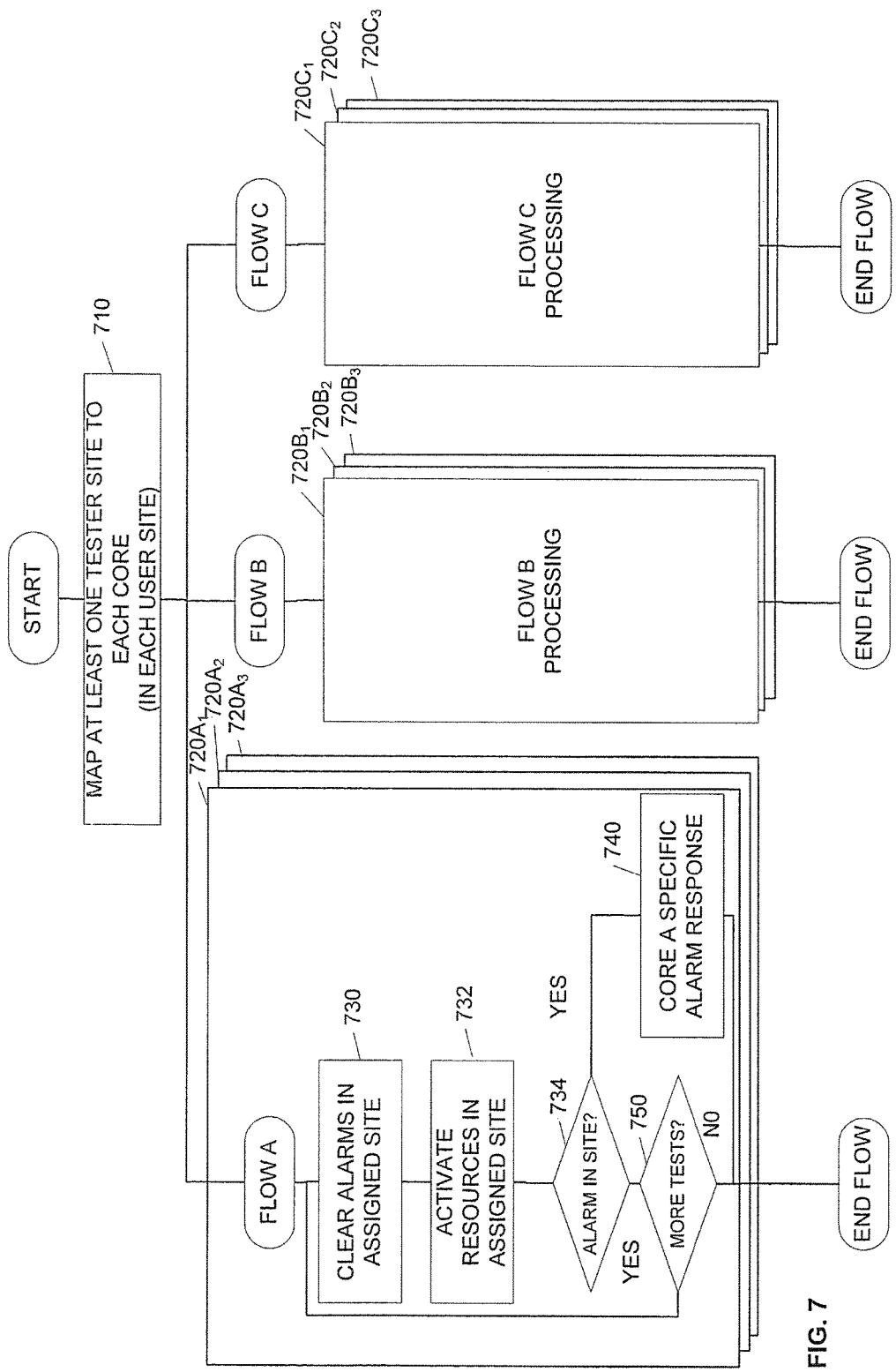
FIG. 7 is a flowchart illustrating execution of a test flow with multiple sub-flows executing concurrently in which a flow specific alarm response may occur.

FIG. 7 shows a testing capability that results from using site regions in this way to allocate resources to different sub-flow instances in which different cores are tested. FIG. 7 illustrates a method of operating a test system. The method illustrated in FIG. 7 may be initiated in response to user input indicating that a specific test program, having a defined flow, is to be executed. In this example, the test flow to be executed includes three sub-flows. Those sub-flows are executed across three user sites. Accordingly, there are three instances for each sub-flow.

In this example, the processing of FIG. 7 begins at block 710 where the tester is configured for execution of the test. This configuration may entail mapping tester sites to each core in each of the user sites. Such a mapping may be achieved, in the illustrative system 100 of FIG. 1, by configuring the signal delivery interface 126 to connect resources, that have been assigned to specific tester sites, to specific pins in the user sites that are in flow domains that use those tester sites. The mapping may be made in any suitable way. However, in some embodiments, the mapping may be made based on configuration commands provided from a computerized tool that allocates resources using site as described herein.

In the example of FIG. 1, configuration commands may include a configuration command 140 identifying for each of multiple resources contained within the test system pins to which the resource is to be connected. Such information may be used to control a mapping within the signal delivery interface components of tester 120. As another example, a configuration command may specify the flow for the test program. Configuration command 142 may provide information about which test blocks are executed in each sub-flow. Configuration command 144 may specify the tester site assignments for each of the resources within test system 120 used for executing the test program. Other information may specify which tester sites are assigned for each instance of each sub-flow. This configuration information allows control component 110 to execute one or more instances of one or more test blocks in one or more user sites, using the appropriate resources for each instance of each test block.

Any suitable inputs may be provided by the user to enable the tool to generate the configuration information. For example, FIG. 1 illustrates a user 130 providing inputs to workstation 132, on which such a tool generating configuration information may execute. That input may define flow domains. Each flow domain may be specified as a group of pins for a representative device under test accessed during a sub-flow of a test program. This information may be provided in any suitable way. For example, it is known in the art to specify pin groups when programming a test system, and flow domains may be specified using techniques known in the art for specifying pin groups.

The flow domains may be specified in connection with a flow. The flow may be specified in any suitable way, such as in a spread sheet, in a test script or in a command line. The information defining a flow may be provided as values entered by a user. Though, the input may be provided by selecting a file that contains such a spread sheet or script. Such a selection may be made directly or indirectly. As an example of an indirect selection, a user may open a work space associated with test plan in which the flow, and possibly other parameters of the test plan, has already been specified. Though, any suitable mechanism to communicate the information may be employed. Regardless of how the flow is specified, it may contain information about sub-flows and test blocks to execute within each sub-flow.

Other inputs, which may be inputs of the type known in the art to configure a test system, may be specified to enable the tool to determine the mapping. For example, the tool executing on workstation 132 may have access to information defining where in connection with the device specific portions of signal delivery interface 126 (FIG. 1) each of the test pins is located. Similarly, the information defining which tester channels are associated with which resources. Additionally, the tool executing on workstation 132, for example, may have access to information about the number of user sites to hold semiconductor devices for concurrent testing.

Other information to which the tool may have access, either from direct user input through a user interface on workstation 132 or by accessing other sources of information about the test program may include resource requirements for execution of each test block.

This information, and any other suitable information as may be conventionally maintained in any test environment, may be accessed by a tool to generate configuration commands that may be provided to a control component, such as control component 110 (FIG. 1) in the test system. Such a tool may create the site regions as described above, including flow-domain specific site regions, a global site region and a system site region. The number of flow-domain specific site regions may be determined by the tool based on the number of sub-flows in the flow specified in the user input. Once the number of site regions is determined, the tool may assign tester sites to these site regions.

Then the tool may assign resources to these tester sites based on how the resources will be used in execution of the test blocks that make up the test program. For example, every resource may be assigned to the tester site used to implement the system site region. Resources accessed in more than one sub-flow instance may be assigned to tester sites implementing the global site region.

Other resources that are used in executing the test blocks associated with the separate flow domains may be assigned to the tester sites implementing the site regions associated with those flow domains. These resources may be assigned such that the resources assigned to different site regions are independent of each other. These assignments may be made to result in functionally independent resources in each site region. Functional independence may be achieved by ensuring that all resources supplied by any physical component are assigned to the same site region. Though, if an underlying physical component supports multiple resources that can be operated independently, such that the signals that can be generated or measured for one of these resource do not depend on either the current or prior programming of others of the resources, functional independence across site regions may be achieved even if resources from the same physical component are assigned to different site regions.

Resources may be allocated to flow domain specific site regions using techniques known in the art to achieve assignment of independent resources to user sites in a test system. However, rather than achieve independence across user sites alone, the allocation will be made to achieve independence across site regions. However, in contrast to a conventional resource allocation task in which each user site is allocated resources to perform the same test functions, the site regions as described above, which might be associated with testing of different types of cores, the resources allocated to the site regions may perform different test functions in different site regions. Nonetheless, techniques as are known in the art—such as techniques for identifying which resources can operate independently and how to select resources to achieve desirable rates or resource utilization—may be applied. Though, any suitable techniques may be used.

In scenarios in which multiple user sites are used, resources may be assigned to tester sites to also achieve independence across user sites. These assignments may be made using techniques as are known in the art or any other suitable techniques. Regardless of how these resource assignments are made, independent resources may be assigned to each sub-flow instance, regardless of the degree of concurrency of the flow specified.

In some embodiments, the resources assigned to the flow domain specific site regions may also be functionally independent of the resources assigned to the global site region. Any suitable mechanism may be used to achieve this independence. For example, resources may be first assigned to the global site region and then removed from consideration in assigning resources to the flow domain specific site regions. Alternatively, the flow domain specific site regions and the global site region may be considered together to make independent resource assignments to all of these site regions.

Once resource assignments are made to site regions, the resources can then be assigned to the tester sites that have been assigned to those site regions. Information identifying appropriate assignments may be communicated to the test system. For example, configuration command 144 shows the resource assignments being communicated to control component 110. Though FIG. 1 schematically illustrates this communication by showing an assignment of a single resource to a single tester site, it should be appreciated that much more information may be communicated in connection with a typical test program. For example, assignments may be communicated for each of multiple resources. Moreover, each resource may be assigned to more than one tester site. Moreover, if resource requirements are different for different test blocks in a sub-flow, in some embodiments, the resource assignments may include information indicating portions of a sub-flow to which a resource assignment applies.

It should be appreciated that FIG. 1 schematically illustrates configuration commands being provided to a control component within a test system. However, configuration commands may be provided in any suitable format and may include information instead of or in addition to the specific configuration commands illustrated in FIG. 1. Moreover, it should be recognized that for a test system containing multiple resources capable of generating and measuring multiple types of test signals at hundreds or possibly thousands of pins and configuration information supplied to the control component may reflect configuration for all such components.

Though a single tool is described as generating the configuration information, it should be recognized that the functions described as being performed by the single tool could be performed by multiple tools. In embodiments in which a test program is being prepared in accordance with some embodiments of the invention for execution on a test system that conventionally performed functions ascribed to the tool, those functions may be performed by tools conventionally included in the test system. As one example, known tools may be used to generate specific configuration commands for a signal delivery interface to connect resources to pins at user sites. Further, in some embodiments, some or all of the configuration information may be specified by a human user without assistance from a computerized tool.

Regardless of which or how the configuration information is generated, the control component may use this information to control components within the test system to execute test blocks in sub-flow instances at appropriate times using appropriate resources. In preparation for execution of a test program, the control component may use that configuration information to map resources to pins. This mapping may be achieved by configuring switching elements within the signal delivery interface portions of the test system or in any other suitable way. Resources may also be associated with the tester sites, such as by writing to registers such as 124A . . . 124N (FIG. 1).

Regardless of how the test system is configured, once configured for a test plan with a particular flow, which may contain multiple sub-flows, testing may begin. Though not expressly shown in FIG. 7, that testing may include a setup portion, which may be achieved, for example, by executing a test block like setup test block 320 (FIG. 3D). Thereafter, the test may execute in concurrent sub-flows. In the example of FIG. 7, three sub-flows are indicated. An instance of each sub-flow may be performed for each user site at which a semiconductor device is to be tested. Though concurrent testing of sub-flows may be performed when even a single user site is used such that only a single semiconductor device is tested at a time, FIG. 7 illustrates concurrent testing at three user sites. Accordingly, sub-flow A includes sub-flow instances $720A_1$, $720A_2$ and $720A_3$. Sub-flow B is likewise executes in three sub-flow instances: $720B_1$, $720B_2$ and $720B_3$. Sub-flow C is likewise executed in three sub-flow instances: $720C_1$, $720C_2$ and $720C_3$.

Processing in each of the sub-flows may be performed in accordance with the same test blocks for each of the sub-flow instances. For example, processing in each of sub-flow instances $720A_1$, $720A_2$ and $720A_3$ may be driven by execution of the same test blocks in the same order. However, conditions associated with the different devices being tested in each of the sub-flow instances may result in any conditional portions of the sub-flow being performed differently in each of the sub-flow instances. Here, conditional processing is achieved through the use of "alarms."

Alarms may be implemented within a test system using techniques as are known in the art. For example, an alarm may be implemented by a hardware component within a test system. The component may detect a condition during execution of a test program and assume a state that signals the condition was detected. In some embodiments, each alarm may be latched when it is triggered by detection of the condition. The detected condition may relate to a voltage or current exceeding or falling below a pre-set level. The specific condition that each alarm detects is not critical to the invention, and in some embodiments, the conditions may be programmed for an alarm.

In conventional test systems, alarms are associated with tester sites. Such a capability, in a conventional test system, associates conditions with devices being tested concurrently at different user sites. Here, based on the assignment of tester sites through site regions, alarms become associated with flow domains such that conditional operations can be performed within flow domains, without impacting other flow domains—even if the flow domains are concurrently executing tests blocks on the same semiconductor device.

FIG. 7 provides an example of such conditional processing in connection with flow A. FIG. 7 illustrates an order of processing that may occur within a sub-flow instance, such as sub-flow instance $720A_1$. In this example, the processing may begin at block 730. At block 730 the alarms associated with the particular sub-flow instance may be cleared. As described above, different tester sites may be assigned to resources to associate specific resources with sub-flow instances. In this way, addressing commands that impact the operation of resources may be directed to resources based on the specific sub-flow instance of an overall test program being executed. In this way, sending commands to resources may cause those resources to perform actions uniquely associated with the testing of a specific core of a specific semiconductor device under test. For example, execution of block 730 as part of sub-flow instance $720A_1$ may clear alarms associated with the test of a specific core in a specific semiconductor device that is being tested.

Similar commands may be executed in other sub-flow instances, such as sub-flow instances $720A_2$ and $720A_3$. However, in the other sub-flow instances, the command may be addressed to different tester sites, causing actions of the test system that are specific to the testing of cores in other semiconductor devices coupled to the test system to other user sites. In this example, each of the sub-flow instances of the same sub-flow test the same type of core in the different user devices that are being tested concurrently. Thus, the same processing steps may be taken in each of the sub-flow instances of the same sub-flow, even if related to different semiconductor devices under test.

In this example, the command executed at block 730 clears alarms. In this example, because the alarm holds an output state indicating detection of a condition until the alarm is cleared, alarms may be cleared at block 730 before they are used as part of a test.

In the embodiment illustrated in FIG. 7, alarms are associated with components that can be assigned to specific tester sites. Accordingly, clearing alarms at block 730 may entail clearing alarms associated with components that have been assigned to one or more of the tester sites assigned to perform testing on the specific core or cores being tested in sub-flow instance $720A_1$. Because tester sites are allocated to implement flow domain specific site regions, the alarms cleared at block 730 are associated with tester sites that are not used in testing other instances of sub-flow A or any of the other sub-flows. In this way clearing the alarms at block 730 may have no impact on testing to be performed in other sub-flow instances for different sub-flows. Because those other sub-flow instances may be associated with testing other cores on the same semiconductor device, clearing the alarms at block 730 need not impact the testing of other cores on the same device in sub-flows B or C (unless the test programs in those other sub-flows are specifically written to access or depend on alarms in sub-flow A or sub-flow instance $720A_1$).

Once the appropriate alarms are cleared, processing within sub-flow instance $720A_1$ may then proceed to block 732. At block 732, resources in the tester site or sites assigned for flow domain specific processing in sub-flow instance $720A_1$ may be activated. The specific resources activated may depend on the test block being executed in sub-flow instance $720A_1$ and the type of test signals to be generated or measured. The specific signals generated and/or measured at block 732 is not critical to the invention and activation may entail activating resources to perform test functions as are known in the art of semiconductor device testing.

Regardless of the specific resources activated, and the nature of the signals generated and/or measured at block 732, processing may proceed to block 734 to determine whether those test functions performed at block 732 have triggered any alarms associated with sub-flow instance $720A_1$. At decision block 734, the process may branch depending on whether any alarm has been activated by those test functions. Processing at block 734 may be performed in any suitable way, including by reading the alarms cleared at block 730 to determine whether any were triggered by test functions performed at block 732.

As described above in connection with block 730, the alarms checked at block 734 may be implemented by components that are uniquely associated with sub-flow instance $720A_1$. Sub-flow instance $720A_1$ may, in turn, be associated with testing of a specific core on a user device. The alarms may therefore be set independently of actions in any of the other sub-flows, such as sub-flows B and C, in which tests of other cores on the same semiconductor device may be tested. Accordingly, if an alarm is detected at block 734, the process may branch to block 740.

At block 740, a core-specific alarm response may be taken. In this case, the alarm response may be specific to the core or cores being tested by execution of test blocks in sub-flow A. For example, in testing some cores, an overvoltage condition may indicate a significant problem for which an appropriate response may be to discontinue testing of that core. For other cores, an alarm indicating an overvoltage condition may indicate an undesirable, but not damaging, transient condition. An appropriate response to such an alarm may be to continue testing at a lower speed to determine whether the transient overvoltage condition can be avoided by operating the core under different conditions. Accordingly, when processing within sub-flow instance $720A_1$ branches from decision block 734 to 740 because of detection of an alarm associated with a tester site allocated for testing within sub-flow instance $720A_1$, the alarm indicates a condition associated with the core for which a test block is being executed in sub-flow instance $720A_1$. Accordingly, by performing at block 740 an alarm response that is programmed as a part of that test block, the response to the alarm is specific to the core for which the test block was written.

This capability may be used by a developer of a test block to write alarm handling code in the test block as if the test block would be executed on a test system without any other test blocks being concurrently executed. If an alarm occurs during execution of that test block, the alarm handling code will be executed at block 740. Even if that test block is executed concurrently with other test blocks, testing other cores on the same semiconductor device, alarms generated as a result of executing other test blocks will not cause execution of the alarm handling code that has been specifically written for handling an alarm detected as part of testing core A at block 740. Because of this independence of alarm conditions, a test block written, even one assuming that the test block will be executed sequentially without other test blocks concurrently executing, may be executed as part of a concurrent flow without the need to specifically write the test block for core A for concurrent execution. Because of this capability, a user of the test system may develop test blocks for cores independent of the manner in which they will be combined into concurrent flows. Yet, the desired operations of the test block will be performed on their associated cores.

Though not expressly illustrated in FIG. 7, similar conditional processing may be performed within Flow B and Flow C. As a result, conditional processing may be performed in each of sub-flows $720B_1$, $720B_2$, $720B_3$, $720C_1$, $720C_2$, and $720C_3$.

The conditional processing may be in any suitable form and may be different in each sub-flow. In this example, following execution of an alarm response that is specific to core A at block 740, the processing within sub-flow instance $720A_1$ is shown to end. However, there is no requirement that processing end in response to detection of an alarm condition. In some scenarios, an alarm response may include recording data, altering testing conditions or taking other actions and then continuing on with testing within sub-flow instance $720A_1$.

Conversely, if no alarm is detected at decision block 734, the process may proceed to decision block 750. From decision block 750, processing within sub-flow instance $720A_1$ may loop back if more testing remains. The process of clearing alarms, performing test functions and then checking for alarms and taking conditional action based on whether an alarm is detected may be repeated until no more test functions remain to be completed for testing the cores to be tested within sub-flow instance $720A_1$.

When testing is completed, the flow may end. However, any suitable steps may be taken following execution of a test block associated with a core. For example, a test block associated with another core to be tested in the same sub-flow may begin. Alternatively or additionally, upon completion of testing within a sub-flow instance, functional testing that involves interaction among multiple cores may be initiated. As another example of a possible variation not expressly illustrated in FIG. 7, upon completion of testing of the semiconductor devices at each of the users sites coupled to a test system, the semiconductor devices at the user sites may be replaced by other semiconductor devices which may then be tested. Accordingly, the processing for Flow A illustrated in FIG. 7 may be performed repeatedly for multiple user devices.

FIG. 7 illustrates a scenario in which actions may be taken in connection with testing a core on a semiconductor device based on alarm conditions detected during the testing of that core. In some scenarios, associating alarm conditions with specific cores with actions specified to be taken in connection with testing of those cores may aid in identifying false or other defects degrading operation of the semiconductor device. In some scenarios, conditioning actions in the testing of one core on conditions detected in another core of the same type on a different semiconductor device being tested may facilitate detection of false or other degraded operating conditions. In other scenarios, conditioning actions in the testing of one core on conditions detected in another core of the same semiconductor device may facilitate detection of false or other degraded operating conditions. Processing as described herein may support conditional processing based on conditions in other cores of the same type on other semiconductor devices or based on conditions in other cores of different types on different semiconductor devices.

Figure 8:
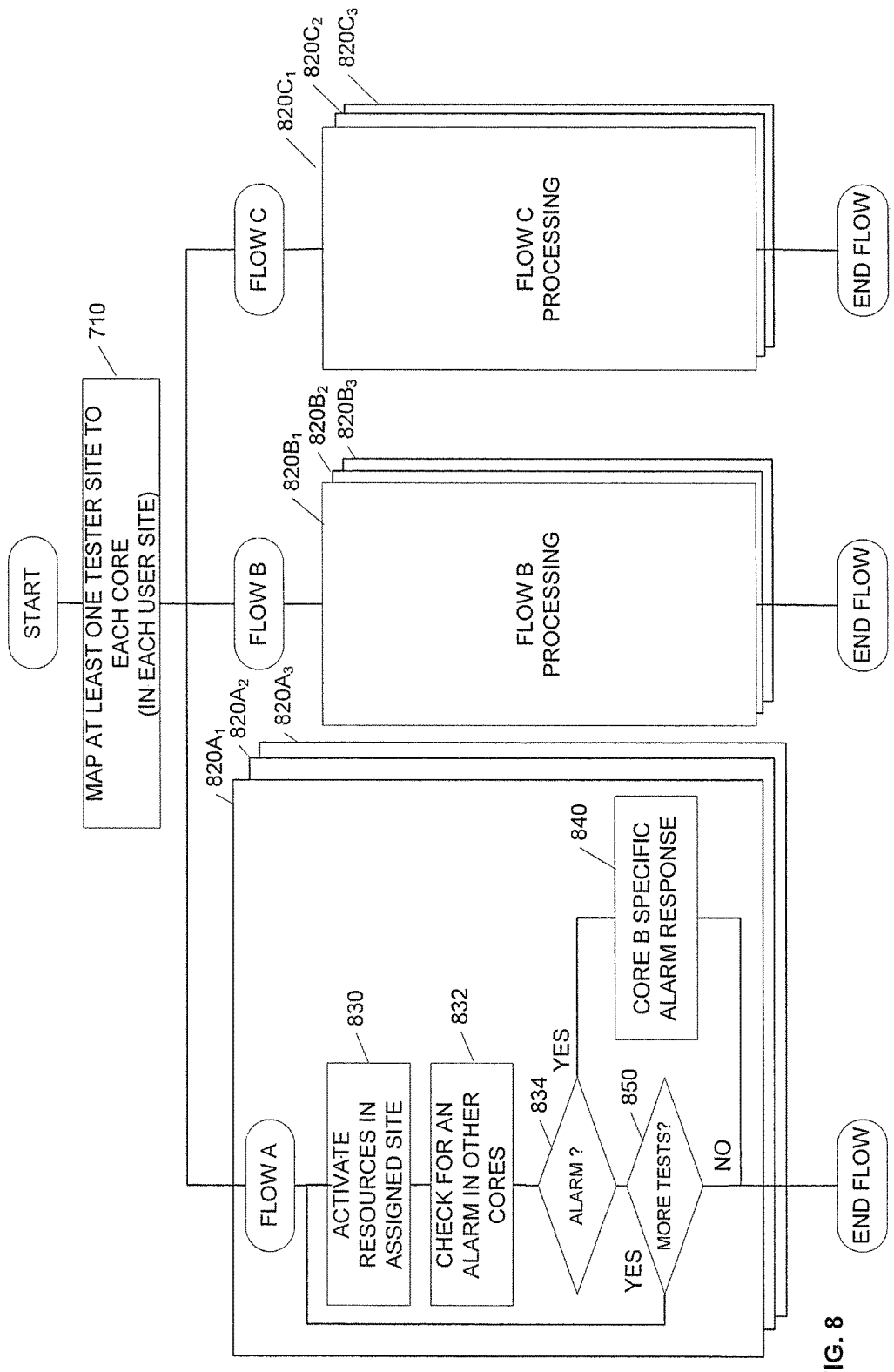
FIG. 8 is a flowchart illustrating execution of a test flow with multiple sub-flows executing concurrently in which an alarm response may occur in one sub-flow based on an alarm in a different sub-flow.

FIG. 8 provides an example of a mechanism by which testing in connection with one core may be conditioned upon events detected in connection with executing a test block in another core of a different type on the same semiconductor device. The testing illustrated in FIG. 8 may be performed generally as described above in connection with FIG. 7. For example, at block 710, the test system may be configured to map at least one tester site to each core to be tested. Each core may be tested by executing a test block, associated with that core, in a sub-flow instance to which tester sites have been assigned.

As in the testing illustrated in FIG. 7, FIG. 8 illustrates testing on three cores, cores A, B and C, which is performed concurrently. Testing of each of the cores is performed in a separate flow domain instance. Moreover, separate flow domain instances are provided for each semiconductor device being tested concurrently. In this example, semiconductor devices are connected to three user sites such that there are three sub-flow instances for each sub-flow. Accordingly, sub-flow instances $820A_1$, $820A_2$ and $820A_3$ execute separate instances of a test block associated with core A. Sub-flow instance $820B_1$, $820B_2$ and $820B_3$ execute separate instances of a test block for testing core B. Likewise, sub-flow instances $820C_1$, $820C_2$ and $820C_3$ represent different sub-flow instances in which a test block for testing a core C is performed.

Any specific test operations may be performed in each of the sub-flows. In this example, specific steps for a sub-flow testing core A are illustrated. In this example, processing in the test block for testing core A begins at block 830. At block 830, resources in one or more tester sites assigned for testing core A may be activated. These resources may be activated in any suitable way to perform any suitable test function. The specific test functions performed at block 830 may depend on the nature of the core being tested, and may be defined using techniques as are known in the art or in any other suitable way.

Regardless of the specific test functions performed at block 830, processing may proceed to block 832. At block 832, a check may be made for an alarm that may have occurred during testing of any one or more cores that is being concurrently tested. Such a check may be made in any suitable way. For example, the check may be made by accessing an alarm associated with a tester site allocated for testing another core. This check may be made based on tester site information specified as part of the test system configuration performed at block 710. Alternatively or additionally, the check made at block 832 may check for alarms in any other tester site. Such a check may be made by checking for alarms in all of the tester sites mapped as part of the mapping performed at block 710. Though, in systems that support a system site region, containing all resources, a check for an alarm in any site may be made by checking for alarms associated with the system site region. The specific tester sites for which alarms are checked at block 832 may depend on the nature of the testing performed in flow domain instance $820A_1$.

Regardless of tester sites checked at block 832, the process may proceed to decision block 834. At decision block 834, processing may branch, depending on whether an alarm was detected. If an alarm was detected, processing may branch to block 840. At block 840, the response to the detected alarm may be performed. This response may be specific to the core being tested in sub-flow A. The response, for example, may be encoded in the test block being executed as part of flow domain instance $820A_1$. However, even when the response is encoded in a test block executing in flow domain instance $820A_1$, that test block may be encoded to take action specific to the test block that generated the alarm. For example, when an alarm condition is detected in sub-flow B, the functions executed in block 840 may be selected based on the structure or function of core B, tested in sub-flow B.

Any suitable processing may be performed at block 840 in response to the detection of an alarm condition. As one example, if during testing a core containing memory elements, an alarm representing a transient voltage or other condition could potentially disrupt information stored in memory, processing at block 840 may be based on an assumption that data stored in a memory element may have been altered for reasons unrelated to a flaw in core A. In response to such a determination, for example, a memory element may be reinitialized with desired data or any other appropriate action may be taken. In this example, once that action is taken, processing within sub-flow A may end. Though, any suitable steps may be taken following completion of that processing.

Conversely, FIG. 8 illustrates that if no alarm is detected, processing may branch from decision block 834 to decision block 850. The process may again branch at decision block 850 depending on whether more test functions remain to be executed within the sub-flow. If so, the processing may loop back and further test functions may be performed. If no further test functions remain, processing within the sub-flow instance $820A_1$ may end. Though processing is illustrated as ending following execution of the sub-flows, as described above in connection with FIG. 7, any suitable actions may be taken after executing the test blocks in each of the test flows. Examples of actions that may be performed include executing functional tests or testing another group of semiconductor devices.

In the example illustrated in FIG. 8, the alarms checked at block 832 are not cleared in sub-flow A. In some scenarios, the alarms may be cleared prior to use in the sub-flow that uses them. Though, when a test program is developed that entails interaction between test blocks that may executed concurrently, a developer of those test blocks may code the test blocks to interact in any suitable way. Accordingly, alarms may be cleared in the test block that reads the alarm and/or in the test block to which the alarm relates.

Figure 9:
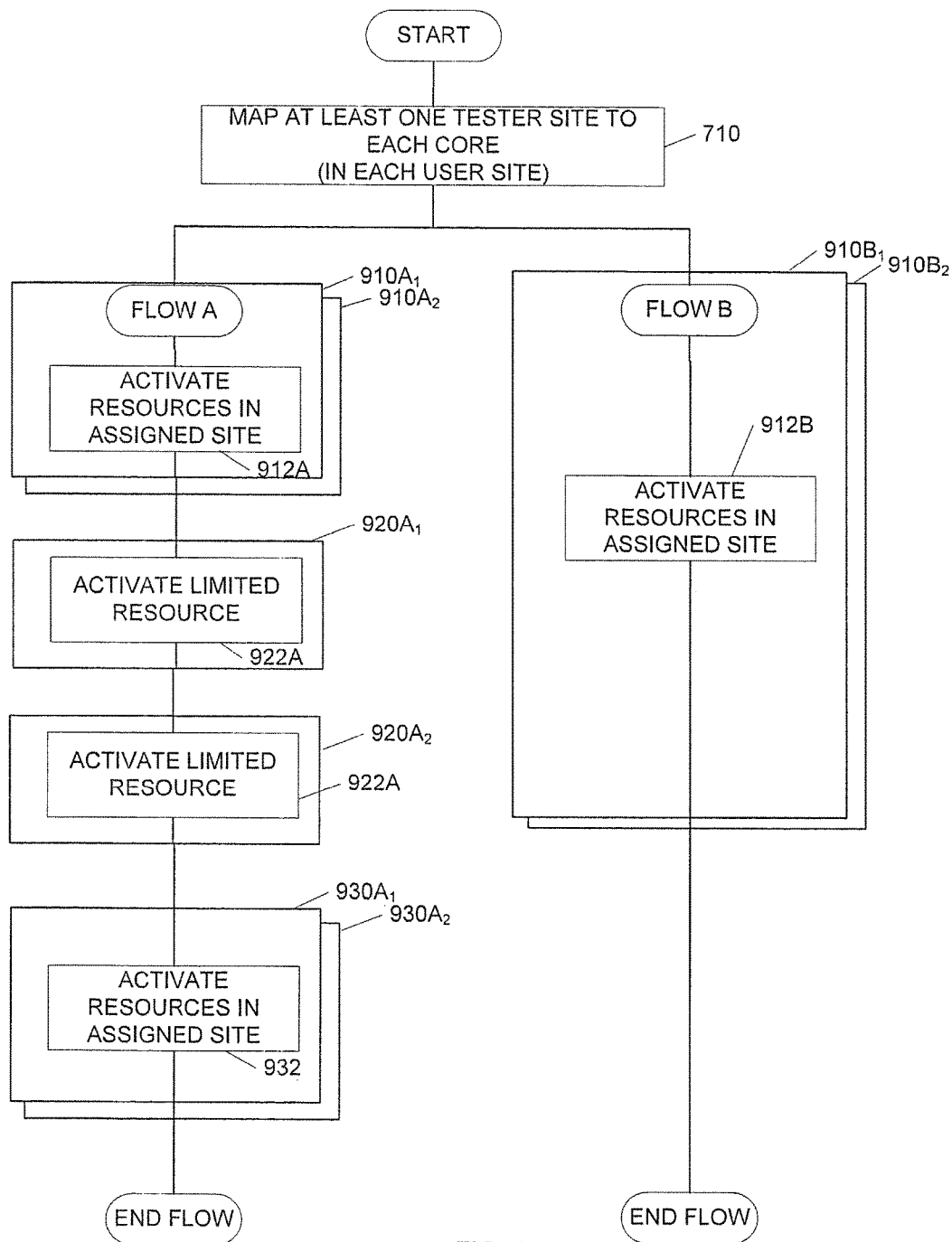
FIG. 9 is a flowchart illustrating execution of a flow with multiple sub-flows in which a site loop enables execution of a sub-flow in a resource constrained test system.

FIG. 9 illustrates a further example of the flexibility that may be achieved by assigning tester sites through site regions in which a first portion of the site regions are flow-domain specific and a second portion of the site regions are potentially shared among flow-domains or flow domain instances. FIG. 9 illustrates a test program having two sub-flows. The test program is shown executing on a test system configured to test two semiconductor devices concurrently. Accordingly, each sub-flow may execute in two instances, each associated with testing one of the semiconductor devices. In the example illustrated, a first sub-flow may be configured to execute a test block configured to test a core A. A second sub-flow may be configured to execute a test block for testing a core B.

In the scenario illustrated, the test program is being executed on a test system that has sufficient resources to allocate resources for both sub-flow instances in which test block B is executed. Though, the system may be resource limited such that the system includes sufficient resources for only one instance of some portion of test block A.

As illustrated, sub-flow instance $910B_1$ and sub-flow instance $910B_2$ execute concurrently. Activating resources at block 912B in sub-flow instance $910B_1$ entails accessing resources assigned to a tester site associated with sub-flow instance $910B_1$. A corresponding block executed in sub-flow instance $910B_2$ may execute the same test block for testing core B as in sub-flow instance $910B_1$. Accordingly, functions corresponding to those illustrated in block 912B may be performed in sub-flow instance $910B_2$. However, in performing those functions in sub-flow instance $910B_2$ independent resources, assigned to different tester sites, may be used to enable the sub-flow instances to execute concurrently.

Similarly, independent resources may be assigned, through the use of different tester sites, to enable independent resources to be accessed in instances of sub-flow A. However, in the scenario illustrated in FIG. 9, concurrent execution of the sub-flow instances is possible in only portions of the sub-flow instances. Accordingly, FIG. 9 illustrates that some portions of the sub-flow instances of sub-flow A are executed concurrently while other portions, those using the limited resource, may be executed sequentially.

In the example of FIG. 9, sub-flow instance portions $910A_1$ and $910A_2$ are executed concurrently. Likewise, subflow portions 930A$_1$ and 930A$_2$ are also executed concurrently. However, sub-flow portions 920A$_1$ and 920A$_2$ are executed sequentially.

For the sub-flow portions that are executed concurrently, independent resources from the flow domain specific site regions are used in each of the sub-flow instances. This independence is achieved by associating the independent resources with different tester sites. Accordingly, processing at block 912A within sub-flow instance portion 910A$_1$ may entail accessing resources assigned to a site associated with sub-flow instance 910A$_1$. A corresponding block in the sub-flow instance portion 910A$_2$ may entail accessing resources assigned to a site associated with sub-flow instance 910A$_2$. Similarly, in sub-flow instance portion 930A$_1$, execution of block 932 may similarly entail accessing resources assigned to a tester site associated with a first sub-flow instance of sub-flow A. A corresponding block executed in sub-flow instance portion 930A$_2$ may entail accessing resources assigned to a site associated with the second sub-flow instance of sub-flow A. Accordingly, resources for these sub-flow instance portions may be done as in sub-flow B, for which all instances are executed concurrently.

In sub-flow A, portions of the sub-flow instances require limited resources, such that there are not sufficient resources of a particular type for concurrent execution of those portions of the sub-flow instances of sub-flow A. However, the same resources may be used in sub-flow instance portion 920A$_1$ and sub-flow instance portion 920A$_2$ by executing these portions sequentially. In this example, in sub-flow instance 920A$_1$, block 922A$_2$ is performed at which those limited resources are activated. In block 922A in sub-flow instance 920A$_1$, those limited resources may be employed for testing a semiconductor device on which the first sub-flow instance of sub-flow A is being executed.

In sub-flow instance portion 920A$_2$ the same limited resources may be used to perform testing on a corresponding portion of a second semiconductor device in which the second instance of the sub-flow A is executing a test on core A. Any suitable mechanism may be used to access the same resources in different sub-flow instance portions. For example, the limited resources may be assigned to multiple tester sites. Such an assignment may result from assigning the limited resources to the global site region or accessing the resources as part of the system site region. Though, any suitable mechanism may be used to access the same resources in different flow domain instances. In this way, the limited resources may be assigned to the tester sites used for each instance of sub-flow A.

Regardless of the manner in which the limited resources are designated such that they may be accessed from multiple instances of the same sub-flow, a mechanism may be provided to control the test system to preform portions of the sub-flow instances sequentially, rather than concurrently. Such a mechanism may include commands, provided by a user programming the test system or from any other suitable source, designating portions of a test block to be executed sequentially for different instances. Such a command may specify that some or all of the resources be the same in each sequentially executed instance. Such commands may be incorporated in the test block itself or may be specified as part of a test program using the test block.

As a specific example of a mechanism to serialize a portion of a test program, it is known in connection with test systems in which tester sites are associated with user sites to enable testing of multiple semiconductor devices concurrently, to specify a site loop. The site loop may designate a portion of a test block for sequential execution. When a control component such as control component 110 (FIG. 1) of a test system receives a designation of a site loop in connection with a test program, it may first configure resources of a test system for executing the designated portion of the test block in a first instance for which the test system is configured to execute at a first user site. Upon execution of that portion of the test block at the first user site, the control component may configure the test system for executing the same portion of the test block at a next user site. The control component may successively configure the test system in this way to execute the portion of the test block in each user site where semiconductor devices are being tested concurrently. The same resources may be applied in each successive iteration of the site loop.

The site loop mechanism, which may be implemented using known techniques, may be adapted in a test system configured as illustrated in FIG. 9. By adapting the site loop mechanism, limited resources may be readily shared to test different instances of a core. As a result, a test engineer or other user of a test system may readily program the test system for sharing resources for testing different instances of a core simply by designating a portion of a test block, written to test that core, as being executed in a site loop. Programming a test system in this way may be simple in comparison to programming required to share limited resources between instances of the same test block. Moreover, if the same test program is to be executed on a test system that has more resources, the designation of the site loop may be removed or disabled, allowing all portions of each instance of the test block to execute concurrently. In this way, the test program may be readily adapted for execution on a test system with limited resources or for more rapid execution on a test system that is not resource limited.

Looping over site regions allows resources to be serialized in connection with testing different types of cores on the same semiconductor device. In the example of FIG. 9, rather than looping over sub-flow instances within flow A, the loop could be over flow A and flow B. In this way, in the first iteration of the loop, limited resources might be applied to testing core A in each semiconductor device being tested concurrently. In this iteration, all or a portion of a test block written to test core A may be executed. In a subsequent iteration, all or a portion of a test block written to test core B may be executed. Because this execution is serialized through the use of the site loop, the portions of the test blocks that are executed within the site loop may share resources or otherwise access resources that are not fully independent.

Though not illustrated in FIG. 9, other variations in the implementation or use of site loops is possible. For example, it should be appreciated that site loops may be nested. For example, access to resources may be serialized across sub-flows and across sub-flow instances within one or more of the sub-flows. Accordingly, it should be appreciated that substantial flexibility is simply provided using the test system programming techniques described herein.

Figure 10:
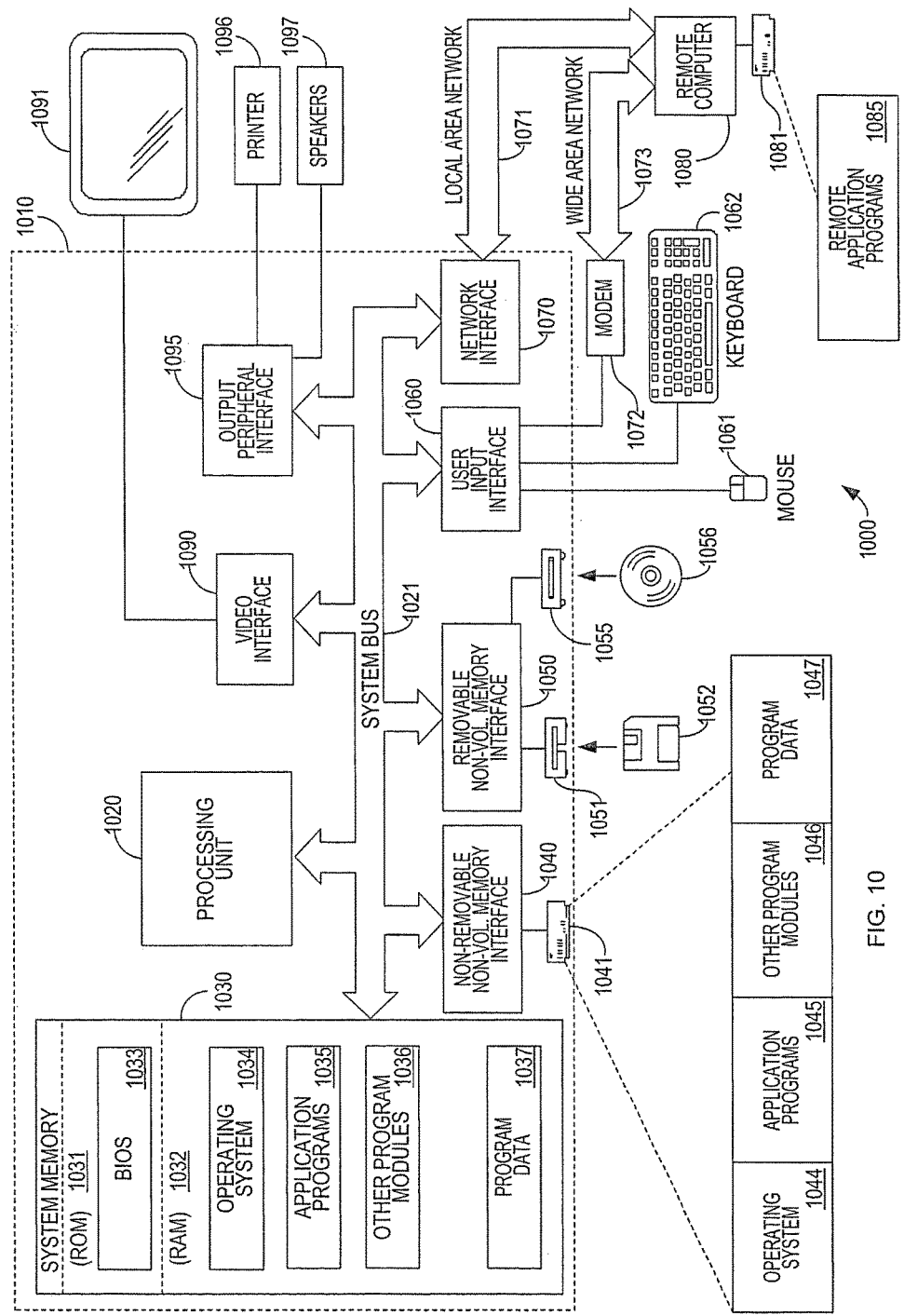
FIG. 10 is a schematic illustration of a computing system that may programmed to configure or control a test system in accordance with some embodiments of the invention.

FIG. 10 illustrates an example of a suitable computing system environment 1000 on which those techniques may be executed. The computing system of FIG. 10 may represent a test system computer that is connected to a test system and may be used to control it while a test is being executed. Though, it should be appreciated that computations leading to an assignment of tester sites to flow domain instances and tester resources to those tester sites may be performed in any suitable computing system.

Accordingly, environment 1000 may represent an environment in which a tool, as described herein, executes. Alternatively or additionally, environment 1000 may be used to partially or fully implement a control component for a test system. The computing system environment 1000 is only one example of a suitable computing environment and is not intended to suggest any limitation as to the scope of use or functionality of the invention. Neither should the computing environment 1000 be interpreted as having any dependency or requirement relating to any one or combination of components illustrated in the exemplary operating environment 1000.

The invention is operational with numerous other general purpose or special purpose computing system environments or configurations. Examples of well known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 10, an exemplary system for implementing the invention includes a general purpose computing device in the form of a computer 1010. Components of computer 1010 may include, but are not limited to, a processing unit 1020, a system memory 1030, and a system bus 1021 that couples various system components including the system memory to the processing unit 1020. The system bus 1021 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 1010 typically includes a variety of computer readable media. Computer readable media can be any available media that can be accessed by computer 1010 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 1010. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 1030 includes computer storage media in the form of volatile and/or nonvolatile memory such as read only memory (ROM) 1031 and random access memory (RAM) 1032. A basic input/output system 1033 (BIOS), containing the basic routines that help to transfer information between elements within computer 1010, such as during start-up, is typically stored in ROM 1031. RAM 1032 typically contains data and/or program modules that are immediately accessible to and/or presently being operated on by processing unit 1020. By way of example, and not limitation, FIG. 10 illustrates operating system 1034, application programs 1035, other program modules 1036, and program data 1037.

The computer 1010 may also include other removable/non-removable, volatile/nonvolatile computer storage media. By way of example only, FIG. 10 illustrates a hard disk drive 1041 that reads from or writes to non-removable, nonvolatile magnetic media, a magnetic disk drive 1051 that reads from or writes to a removable, nonvolatile magnetic disk 1052, and an optical disk drive 1055 that reads from or writes to a removable, nonvolatile optical disk 1056 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 1041 is typically connected to the system bus 1021 through an non-removable memory interface such as interface 1040, and magnetic disk drive 1051 and optical disk drive 1055 are typically connected to the system bus 1021 by a removable memory interface, such as interface 1050.

The drives and their associated computer storage media discussed above and illustrated in FIG. 10, provide storage of computer readable instructions, data structures, program modules and other data for the computer 1010. In FIG. 10, for example, hard disk drive 1041 is illustrated as storing operating system 1044, application programs 1045, other program modules 1046, and program data 1047. Note that these components can either be the same as or different from operating system 1034, application programs 1035, other program modules 1036, and program data 1037. Operating system 1044, application programs 1045, other program modules 1046, and program data 1047 are given different numbers here to illustrate that, at a minimum, they are different copies. A user may enter commands and information into the computer 1010 through input devices such as a keyboard 1062 and pointing device 1061, commonly referred to as a mouse, trackball or touch pad. Other input devices (not shown) may include a microphone, joystick, game pad, satellite dish, scanner, or the like. These and other input devices are often connected to the processing unit 1020 through a user input interface 1060 that is coupled to the system bus, but may be connected by other interface and bus structures, such as a parallel port, game port or a universal serial bus (USB). A monitor 1091 or other type of display device is also connected to the system bus 1021 via an interface, such as a video interface 1090. In addition to the monitor, computers may also include other peripheral output devices such as speakers 1097 and printer 1096, which may be connected through a output peripheral interface 1095.

The computer 1010 may operate in a networked environment using logical connections to one or more remote computers, such as a remote computer 1080. The remote computer 1080 may be a personal computer, a server, a router, a network PC, a peer device or other common network node, and typically includes many or all of the elements described above relative to the computer 1010, although only a memory storage device 1081 has been illustrated in FIG. 10. The logical connections depicted in FIG. 10 include a local area network (LAN) 1071 and a wide area network (WAN) 1073, but may also include other networks. Such networking environments are commonplace in offices, enterprise-wide computer networks, intranets and the Internet.

When used in a LAN networking environment, the computer 1010 is connected to the LAN 1071 through a network interface or adapter 1070. When used in a WAN networking environment, the computer 1010 typically includes a modem 1072 or other means for establishing communications over the WAN 1073, such as the Internet. The modem 1072, which may be internal or external, may be connected to the system bus 1021 via the user input interface 1060, or other appropriate mechanism. In a networked environment, program modules depicted relative to the computer 1010, or portions thereof, may be stored in the remote memory storage device. By way of example, and not limitation. FIG. 10 illustrates remote application programs 1085 as residing on memory device 1081. It will be appreciated that the network connections shown are exemplary and other means of establishing a communications link between the computers may be used.

It should be appreciated that a system as described above may be used in a method of testing a semiconductor device. Such testing may include operating a test system to test a device that has a plurality of cores, each core having a plurality of pins, and the test system having multiple tester-sites, each tester-site having hardware resources by configuring the test system by mapping each of a plurality of tester-sites to an associated core of the plurality of cores such that the hardware resources of each tester site are configured to access the pins of the associated core; and executing a test flow with a plurality of test blocks, each test block testing a core of the plurality of cores by controlling hardware resources in the associated tester site, some of the test blocks being executed concurrently. Though, such operation may include different or additional acts, as described herein.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

The capability to define flow domains as described above may be used in multiple ways. For example, multiple flow domains, which are never executed concurrently, may be assigned to the same site region. Such an assignment may be made because the independence that multiple site regions offers is not needed in the case of flow domains that are never executed concurrently. Such an approach may reduce the required number of supported tester sites.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable storage medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other tangible computer storage medium) encoded with one or more programs that, when executed on one or more computers or other processors, perform methods that implement the various embodiments of the invention discussed above. As is apparent from the foregoing examples, a computer readable storage medium may retain information for a sufficient time to provide computer-executable instructions in a non-transitory form. Such a computer readable storage medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine. Alternatively or additionally, the invention may be embodied as a computer readable medium other than a computer-readable storage medium, such as a propagating signal.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a test system to test a device that has a plurality of cores, each core having a plurality of pins, and the test system having multiple tester-sites, each tester-site having hardware resources, and a signal delivery interface that is configurable to connect the hardware resources to the pins, the method comprising:

configuring the test system by connecting the hardware resources to the plurality of pins of the plurality of cores, wherein the hardware resources are connected through the signal delivery interface configured in accordance with a mapping, wherein the mapping comprises a plurality of flow domains, each flow domain being associated with at least one core of the plurality of cores and wherein the mapping specifies connections between each of a plurality of tester-sites and an associated core of the plurality of cores such that the hardware resources of each tester site are connected to access the pins of the associated core and the hardware resources connected to pins of cores in each of the plurality of flow domains are operable independently of the hardware resources connected to pins of cores in the others of the plurality of flow domains; and executing a test flow with a plurality of test blocks, each test block testing a core of the plurality of cores by controlling hardware resources in the associated tester site to generate or measure one or more types of signals at the pins of the core being tested, some of the test blocks being executed concurrently so as to provide a first sub-flow and a second sub-flow, wherein:

the cores tested by test blocks in each sub-flow are associated with a flow domain of the plurality of flow domains;

the executing comprises independently taking action in each of the first sub-flow and the second sub-flow; and independently taking action comprises executing a test block of the plurality of test blocks based on alarm detection in the second sub-flow and independent of alarm detection in the first sub-flow.

2. The method of claim 1, wherein:

executing the test flow with the plurality of test blocks with some of the test blocks being executed concurrently comprises:

at a first time, executing a first portion of the plurality of test blocks concurrently; and at a second time, executing a second portion of the plurality of test blocks sequentially such that, during sequential execution of the second portion of the test blocks, a single test block is executed at a time.

3. The method of claim 1, wherein:

the plurality of cores comprises cores of a plurality of types; and the method further comprises partitioning the tester sites into groups, each of the groups being mapped to a type of the plurality of types of cores.

4. The method of claim 1, wherein:
the plurality of tester sites include flow domain specific resources, global resources and sequential resources.

5. The method of claim 1, further comprising:
configuring the test system at a first time during execution of a test flow to use a first resource in a first flow domain; and
configuring the test system at a second time during execution of the test flow to use the first resource in a second flow domain.

6. A method of operating a test system of the type having hardware resources that can be associated with at least one tester site of a plurality of tester sites, each tester site having a site identifier such that hardware resources of the test system associated with a tester site process a command directed to the site, the method comprising:
configuring the test system to test at least one semiconductor component comprising a plurality of pins and a plurality of cores, each core comprising a sub-set of the plurality of pins, the configuring comprising, for each of the plurality of cores, associating a tester site of the plurality of tester sites with the core such that hardware resources associated with the tester site access corresponding pins of the associated core during a test; and
executing a plurality of test blocks in accordance with a test flow, each of the test blocks being configured to test a respective at least one associated core, a portion of the plurality of test blocks being executed concurrently in a plurality of sub-flows, each of the plurality of test blocks controlling operation of hardware resources in a tester site associated with the respective at least one associated core to generate or measure one or more types of signals at the pins of the at least one associated core,
wherein at least one of the plurality of test blocks is executed to control operation of an instrument to generate or measure a voltage or current at a digital pin of the semiconductor component, and
wherein the test system comprises hardware components to perform localized alarming associated with at least one sub-flow.

7. The method of claim 6, further comprising:
receiving user input defining flow domains grouping pins, each flow domain including the pins of a core accessible by a tester site;
allocating tester sites to the flow domains.

8. The method of claim 6, further comprising:
generating information for configuring the test system by:
receiving, at a computing device, user input identifying groups of the plurality of pins, each group indicating pins accessed during test of a core of the plurality of cores; and
with the computing device, determining an allocation of tester sites of the plurality of tester sites to the identified groups.

9. The method of claim 8, wherein:
there are no overlaps between the tester sites associated with the identified groups.

10. The method of claim 8, wherein:
hardware resources associated with different ones of the identified groups are isolated from each other.

11. The method of claim 8, wherein flow domain specific processing is performed.

12. The method of claim 11, wherein the flow domain specific processing comprises a site loop.

13. The method of claim 8, wherein:
each of the identified groups of pins is accessed within a sub-flow in which an associated test block is executed; and
executing the plurality of test blocks comprises, for each of the test blocks, accessing pins in the group for the associate sub-flow under control of the test block.

14. The method of claim 13, wherein:
each test block accesses pins in only one flow domain.

15. The method of claim 13, wherein:
at least one core is mapped to multiple tester sites.

16. The method of claim 6, wherein:
each of the identified groups of pins comprises a flow domain.

17. The method of claim 6, wherein:
the method further comprises, at a first time, receiving input specifying the portion of the test blocks for concurrent execution; and
at a second time, receiving user input specifying sequential execution of the plurality of test blocks; and
in response to the user input, sequentially executing the plurality of test blocks.

18. The method of claim 6, wherein:
the at least one semiconductor component comprises a plurality of like semiconductor components, each of the like semiconductor components comprising a like plurality of cores, the plurality of cores on each of the plurality of devices comprising cores of a plurality of types; and
the tester sites are partitioned into a plurality of site regions, each site region being associated with a type of core such that each tester site within the group is associated with a core of the type on a device of the group of devices.

19. The method of claim 18, further comprising:
automatically determining the plurality of site regions based on user input specifying flow domains and a number of the plurality of like semiconductor components.

20. The method of claim 18, further comprising:
based on user input about the flow domains and plurality of like semiconductor components, automatically determining a mapping between tester sites and flow domains.

21. The method of claim 18, wherein:
executing the plurality of test blocks in accordance with the test flow comprises executing a first test block in a plurality of test block instances, each test block instance testing a like core of a semiconductor component of the plurality of semiconductor components, the executing comprising independently taking action in each of the plurality of test block instances.

22. The method of claim 21, wherein:
independently taking action with respect to each of the plurality of cores in each device of the group of devices being tested by a specified test block comprises, for a core of a device of the group, conditionally taking action based on results of testing on one or more of the plurality of cores in the device.

23. The method of claim 22, wherein:
conditionally taking action based on results of testing on one or more of the plurality of cores in the device comprises taking a conditional action during execution of a test on a first core of a device based on a result of concurrent testing of a second core within the device.

24. The method of claim 18, wherein:
the plurality of site regions comprises a first type of site regions, each of the first type of site regions being associated in a one-to-one relationship with a user specified flow domain representing a plurality of pins accessed during a sub-flow; and the tester sites are further partitioned into at least one additional type of site region.

25. The method of claim 24, wherein:

the at least one additional type of site region comprises a System site region, the system site region having associated therewith all tester resources available for executing the plurality of test blocks.

26. The method of claim 24, wherein:

the at least one additional type of site region comprises a Global site region, the Global site region having associated therewith tester resources available for executing the plurality of test blocks that are not associated with any site region of the first type.

27. A method of operating a test system of the type having hardware resources that can be associated with at least one tester site of a plurality of tester sites, each tester site having a site identifier such that hardware resources of the test system associated with a tester site process a command directed to the site, the method comprising:

configuring the test system to test at least one semiconductor component comprising a plurality of pins and a plurality of cores, each core comprising a sub-set of the plurality of pins, the configuring comprising, for each of the plurality of cores, associating a tester site of the plurality of tester sites with the core such that hardware resources associated with the tester site access corresponding pins of the associated core during a test; and executing a plurality of test blocks in accordance with a test flow, each of the test blocks being configured to test a respective at least one associated core, a portion of the plurality of test blocks being executed concurrently in a plurality of sub-flows, each of the plurality of test blocks controlling operation of hardware resources in a tester site associated with the respective at least one associated core to generate or measure one or more types of signals at the pins of the at least one associated core, wherein at least one of the plurality of test blocks is executed to control operation of an instrument to generate or measure a voltage or current at a digital pin of the semiconductor component, and wherein the test system comprises hardware components to perform localized alarming associated with at least one sub-flow, wherein:

a plurality of groups of pins are designated, each group corresponding to pins accessed during testing of a sub-flow of the plurality of sub-flows;

the tester comprises hardware components to independently detect alarm condition associated with each of the plurality of groups of pins;

executing the plurality of test blocks in accordance with the test flow comprises concurrently executing a first test block in a first sub-flow with a first group of the plurality of groups associated pins and a second test block in a second sub-flow with a second group of the plurality of groups of associated pins, the executing comprising independently taking action in each of the first sub-flow and the second sub-flow; and independently taking action comprises executing the second test block based on alarm detection associated with the second group and independent of alarm detection associated with the first group.

28. A method of manufacturing at least one semiconductor component, the method comprising:

operating a test system according to the method of claim 6 so as to perform a test of the at least one semiconductor component; and performing at least one manufacturing operation on the at least one semiconductor component based on results of the test.

29. A method of programming a test system for concurrent testing a plurality of like devices, each device having a plurality of cores, each of the plurality of cores having a plurality of test points, and the test system having a plurality of tester sites, wherein the test system is configurable to associate tester resources with tester sites of the plurality of tester sites, and wherein the test system comprises a signal delivery interface connected to input/output ports of tester resources and having a plurality of contact mechanisms configured to make connection with the test points on the plurality of cores, the method comprising:

with at least one processor:

receiving user input defining a plurality of flow domains, each of the flow domains being defined by a set of test points of a representative device, each flow domain comprising test pins accessed during execution of test blocks in a sub-flow;

receiving user input mapping tester resources to channels of the test system assigned to test pins in each of the plurality of flow domains; and generating, based on the user input, a partitioning of tester sites into a plurality of site regions, each site region corresponding to a flow domain, and each site region comprising a plurality of tester sites, each tester site being mapped to an instance of the flow domain on a device of the plurality of devices, the tester sites of the site region collectively providing resources for executing a test on instances of the flow domain on the plurality of devices; and configuring the signal delivery interface so as to connect the input/output ports of the tester resources with the test points on the plurality of cores in accordance with the generated partitioning, wherein the test system comprises hardware components to perform localized alarming associated with at least one flow domain.

30. The method of claim 29, further comprising:

receiving a specification of a plurality of test blocks, each test block being associated with a flow domain;

associating each test block with a site region based on the associated flow domain; and for each test block, configuring the test system to execute the test block in each instance of the associated flow domain instance on the plurality of devices, the test system being configured to execute the test block using tester sites of the associated site region.

31. The method of claim 29, wherein:

the partitioning of the tester sites further comprises a global site region, the global site region providing access to one or more tester resources not accessible through each of the plurality of site regions.

32. The method of claim 31, wherein:

the partitioning of the tester sites further comprises a system site region, the system site region providing access to all of the tester resources accessible through each of the plurality of site regions and the global site region.

* * * * *